US012804908B2

(12) United States Patent
Kim

(10) Patent No.: US 12,804,908 B2
(45) Date of Patent: Nov. 17, 2026

(54) SEMICONDUCTOR MEMORY DEVICE INCLUDING FERROELECTRIC PATTERNS AND ELECTRONIC SYSTEM INCLUDING THE SAME

(71) Applicant: SAMSUNG ELECTRONICS CO., LTD., Suwon-si (KR)

(72) Inventor: Juhyung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 634 days.

(21) Appl. No.: 18/363,592

(22) Filed: Aug. 1, 2023

(65) Prior Publication Data

US 2024/0224535 A1 Jul. 4, 2024

(30) Foreign Application Priority Data

Jan. 2, 2023 (KR) ........................ 10-2023-0000348

(51) Int. Cl.
*H10B 51/20* (2023.01)
*H10B 51/30* (2023.01)
*H10D 64/68* (2025.01)

(52) U.S. Cl.
CPC ............. *H10B 51/20* (2023.02); *H10B 51/30* (2023.02); *H10D 64/681* (2025.01); *H10D 64/689* (2025.01); *H10D 64/691* (2025.01)

(58) Field of Classification Search
CPC ........ H10B 51/00; H10B 51/10; H10B 51/20; H10B 51/30; H10D 64/681; H10D 64/689; H10D 64/691
See application file for complete search history.

(56) References Cited

U.S. PATENT DOCUMENTS

| | | | |
|---|---|---|---|
| 7,297,602 | B2 | 11/2007 | Hsu et al. |
| 9,679,893 | B2 | 6/2017 | Yan et al. |
| 10,872,905 | B2 | 12/2020 | Muller |
| 11,107,901 | B2 | 8/2021 | Lien et al. |
| 11,114,564 | B2 | 9/2021 | Chen et al. |
| 11,171,157 | B1 | 11/2021 | Lai et al. |

(Continued)

FOREIGN PATENT DOCUMENTS

| | | | |
|---|---|---|---|
| KR | 20190123163 A * | 10/2019 | ........ H01L 27/11536 |
| KR | 10-2414883 | 6/2022 | |

(Continued)

*Primary Examiner* — Matthew E Warren
(74) *Attorney, Agent, or Firm* — Morgan, Lewis & Bockius LLP

(57) ABSTRACT

A semiconductor memory device includes a stack disposed on a substrate and vertical structures that penetrate the stack. The stack includes electrodes and cell insulating layers that are alternately stacked on top of each other. Each of the vertical structures includes a vertical channel pattern that penetrates the stack and a data storage structure disposed between the electrodes and the vertical channel pattern. The data storage structure includes first ferroelectric patterns that are respectively disposed on side surfaces of the electrodes, and first conductive patterns that are disposed between the first ferroelectric patterns and the vertical channel pattern. The first ferroelectric patterns and the first conductive patterns are spaced apart from each other in a direction perpendicular to a top surface of the substrate with the cell insulating layers interposed therebetween.

20 Claims, 17 Drawing Sheets

(56) References Cited

U.S. PATENT DOCUMENTS

| | | | | |
|---|---|---|---|---|
| 11,302,716 | B2 | 4/2022 | Makala et al. | |
| 2021/0272970 | A1 | 9/2021 | Lee et al. | |
| 2023/0180481 | A1* | 6/2023 | Bae | H10B 51/20<br>257/295 |
| 2023/0345727 | A1* | 10/2023 | Fujimura | H10B 41/27 |
| 2024/0040794 | A1* | 2/2024 | Yoon | H10D 64/035 |
| 2024/0099015 | A1* | 3/2024 | Lee | H10B 51/20 |

FOREIGN PATENT DOCUMENTS

| | | | | | |
|---|---|---|---|---|---|
| KR | 20240004061 | A | * | 1/2024 | G11C 11/223 |
| KR | 102817641 | B1 | * | 6/2025 | H10B 51/30 |

* cited by examiner

SEMICONDUCTOR MEMORY DEVICE INCLUDING FERROELECTRIC PATTERNS AND ELECTRONIC SYSTEM INCLUDING THE SAME

CROSS-REFERENCE TO RELATED APPLICATIONS

This U.S. non-provisional patent application claims priority under 35 U.S.C. § 119 from Korean Patent Application No. 10-2023-0000348, filed on Jan. 2, 2023 in the Korean Intellectual Property Office, the contents of which are herein incorporated by reference in their entirety.

TECHNICAL FIELD

Embodiments of the present disclosure are directed to a semiconductor memory device and an electronic system including the same.

DISCUSSION OF THE RELATED ART

A semiconductor device that can store a large amount of data is needed for many electronic systems. Accordingly, research is being conducted to increase the data storage capacity of semiconductor devices. For example, semiconductor devices with three-dimensionally arranged memory cells are being suggested.

SUMMARY

An embodiment of the inventive concept provides a semiconductor memory device with increased reliability and integration density.

An embodiment of the inventive concept provides an electronic system that includes a semiconductor memory device.

According to an embodiment of the inventive concept, a semiconductor memory device includes a stack disposed on a substrate and vertical structures that penetrate the stack. The stack includes electrodes and cell insulating layers that are alternately stacked on top of each other. Each of the vertical structures includes a vertical channel pattern that penetrates the stack and a data storage structure disposed between the electrodes and the vertical channel pattern. The data storage structure includes first ferroelectric patterns that are respectively disposed on side surfaces of the electrodes, and first conductive patterns that are disposed between the first ferroelectric patterns and the vertical channel pattern. The first ferroelectric patterns and the first conductive patterns are spaced apart from each other in a direction perpendicular to a top surface of the substrate with the cell insulating layers interposed therebetween.

According to an embodiment of the inventive concept, a semiconductor memory device includes a stack disposed on a substrate and vertical structures that penetrate the stack. The stack includes electrodes and cell insulating layers that are alternately stacked on top of each other. Each of the vertical structures includes a vertical channel pattern that penetrates the stack and a data storage structure disposed between the electrodes and the vertical channel pattern. The data storage structure includes first ferroelectric patterns disposed on side surfaces of the electrodes, respectively, first conductive patterns disposed between the first ferroelectric patterns and the vertical channel pattern, second ferroelectric patterns disposed between the first conductive patterns and the vertical channel pattern, second conductive patterns disposed between the second ferroelectric patterns and the vertical channel pattern, and a third ferroelectric pattern disposed between the second conductive patterns and the vertical channel pattern. The third ferroelectric pattern extends along a side surface of the vertical semiconductor layer and is connected in common to the second conductive patterns.

According to an embodiment of the inventive concept, an electronic system includes a main substrate, a semiconductor memory device disposed on the main substrate, and a controller disposed on the main substrate and electrically connected to the semiconductor memory device. The semiconductor memory device includes a stack that includes electrodes and cell insulating layers that are alternately stacked on top of each other, and vertical structures that penetrate the stack. Each of the vertical structures includes a vertical channel pattern that penetrates the stack and a data storage structure disposed between the electrodes and the vertical channel pattern. The data storage structure includes first ferroelectric patterns that are disposed on side surfaces of the electrodes, and first conductive patterns that are disposed between the first ferroelectric patterns and the vertical channel pattern. The first ferroelectric patterns and the first conductive patterns are spaced apart from each other in a direction perpendicular to a top surface of the substrate with the cell insulating layers interposed therebetween.

DETAILED DESCRIPTION

Figure 1:
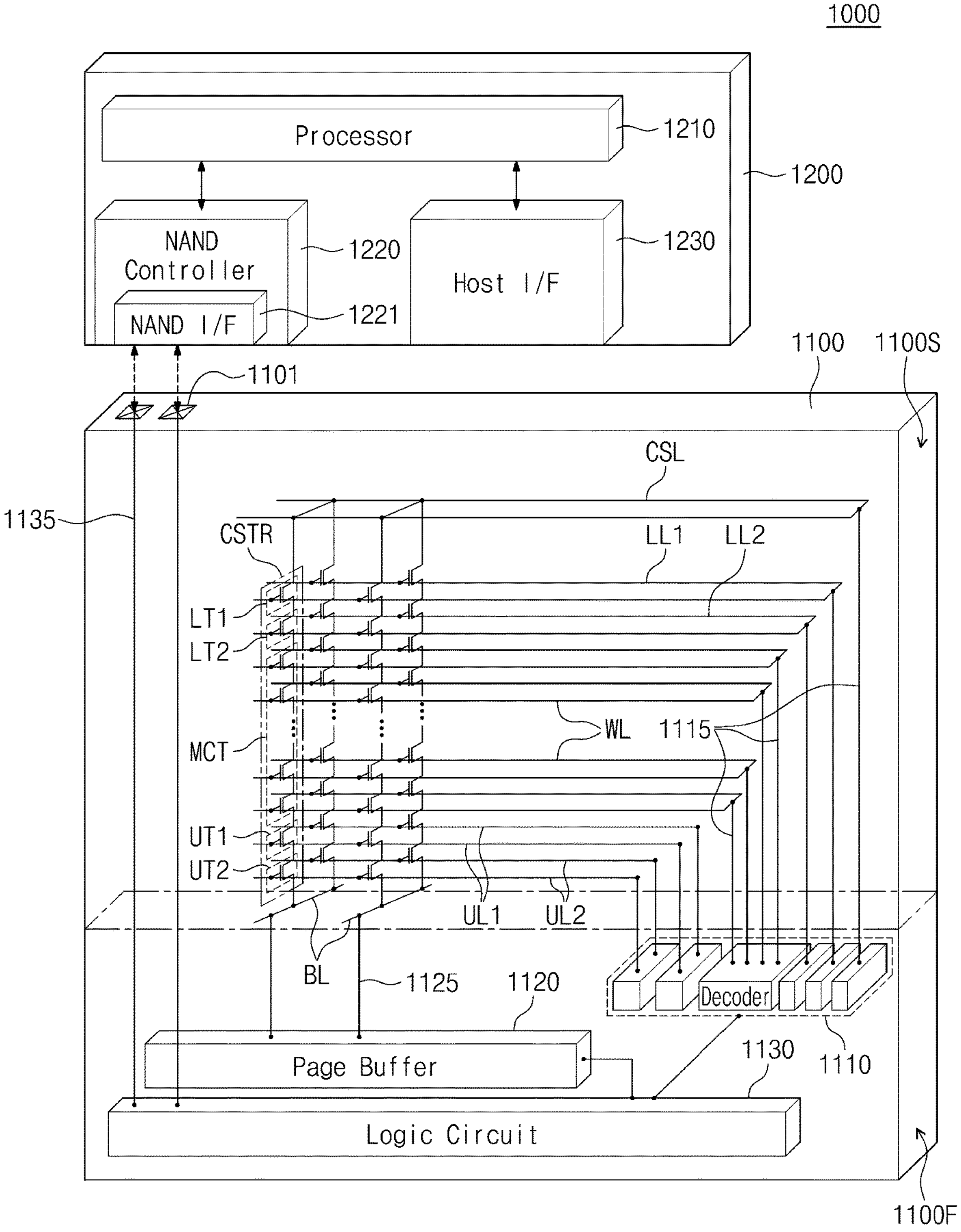
FIG. 1 schematically illustrates an electronic system that includes a semiconductor memory device according to an embodiment of the inventive concept.

Embodiments of the inventive concepts will now be described more fully with reference to the accompanying drawings, in which illustrative embodiments are shown. Like reference numerals in the drawings may denote like elements, and thus their descriptions may be omitted.

FIG. 1 schematically illustrates an electronic system that includes a semiconductor memory device according to an embodiment of the inventive concept.

Referring to FIG. 1, an electronic system 1000 according to an embodiment of the inventive concept includes a semiconductor memory device 1100 and a controller 1200 electrically connected to the semiconductor memory device 1100. The electronic system 1000 may be a storage device that includes one or more semiconductor memory devices 1100, or an electronic device that includes the storage device. For example, the electronic system 1000 may be one of a solid state drive (SSD) device, a universal serial bus (USB), a computing system, a medical system, or a communication system, in which at least one semiconductor memory device 1100 is provided.

In an embodiment, the semiconductor memory device 1100 is a nonvolatile memory device, such as a NAND FLASH memory device. The semiconductor memory device 1100 includes a first structure 1100F and a second structure 1100S on the first structure 1100F. For example, the first structure 1100F is disposed beside the second structure 1100S. The first structure 1100F is a peripheral circuit structure that includes a decoder circuit 1110, a page buffer 1120, and a logic circuit 1130. The second structure 1100S is a memory cell structure that includes a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR includes lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may vary, according to embodiments.

In an embodiment, at least one of the upper transistors UT1 and UT2 includes the string selection transistor, and at least one of the lower transistors LT1 and LT2 includes a ground selection transistor. The gate lower lines LL1 and LL2 are used as gate electrodes of the lower transistors LT1 and LT2, respectively. The word lines WL are used as gate electrodes of the memory cell transistors MCT, and the gate upper lines UL1 and UL2 are used as gate electrodes of the upper transistors UT1 and UT2, respectively.

In an embodiment, the lower transistors LT1 and LT2 include a lower erase control transistor LT1 and a ground selection transistor LT2 that are connected in series. The upper transistors UT1 and UT2 include a string selection transistor UT1 and an upper erase control transistor UT2 that are connected in series. At least one of the lower and upper erase control transistors LT1 and UT2 is used for an erase operation that erases data that are stored in the memory cell transistors MCT by using a gate-induced drain leakage (GIDL) phenomenon.

The common source line CSL, the first and second gate lower lines LL1 and LL2, the word lines WL, and the first and second gate upper lines UL1 and UL2 are electrically connected to the decoder circuit 1110 through first connection lines 1115 that extend from a region in the first structure 1100F to a region in the second structure 1100S. The bit lines BL are electrically connected to the page buffer 1120 through second connection lines 1125 that extend from a region in the first structure 1100F to a region in the second structure 1100S.

In the first structure 1100F, the decoder circuit 1110 and the page buffer 1120 control an operation that is performed on at least one memory cell transistor MCT by a selection memory cell transistor. The decoder circuit 1110 and the page buffer 1120 are controlled by the logic circuit 1130. The semiconductor memory device 1100 communicates with the controller 1200 through an input/output pad 1101 that is electrically connected to the logic circuit 1130. The input/output pad 1101 is electrically connected to the logic circuit 1130 through an input/output connection line 1135 in the first structure 1100F that extends into the second structure 1100S.

The controller 1200 includes a processor 1210, a NAND controller 1220, and a host interface 1230. In an embodiment, the electronic system 1000 includes a plurality of semiconductor memory devices 1100, and the controller 1200 controls the semiconductor memory devices 1100.

The processor 1210 controls overall operations of the electronic system 1000 that include the controller 1200. In an embodiment, the processor 1211 is operated by specific firmware and controls the NAND controller 1220 to access the semiconductor memory device 1100. The NAND controller 1220 includes a NAND interface 1221 for communicating with the semiconductor memory device 1100. The NAND interface 1221 can transmit and receive control commands that control the semiconductor memory device 1100, and data that will be written in or read from the memory cell transistors MCT of the semiconductor memory device 1100, etc. The host interface 1230 allows for communication between the electronic system 1000 and an external host. When a control command is received from the external host through the host interface 1230, the processor 1210 controls the semiconductor memory device 1100 in response to the control command.

Figure 2:
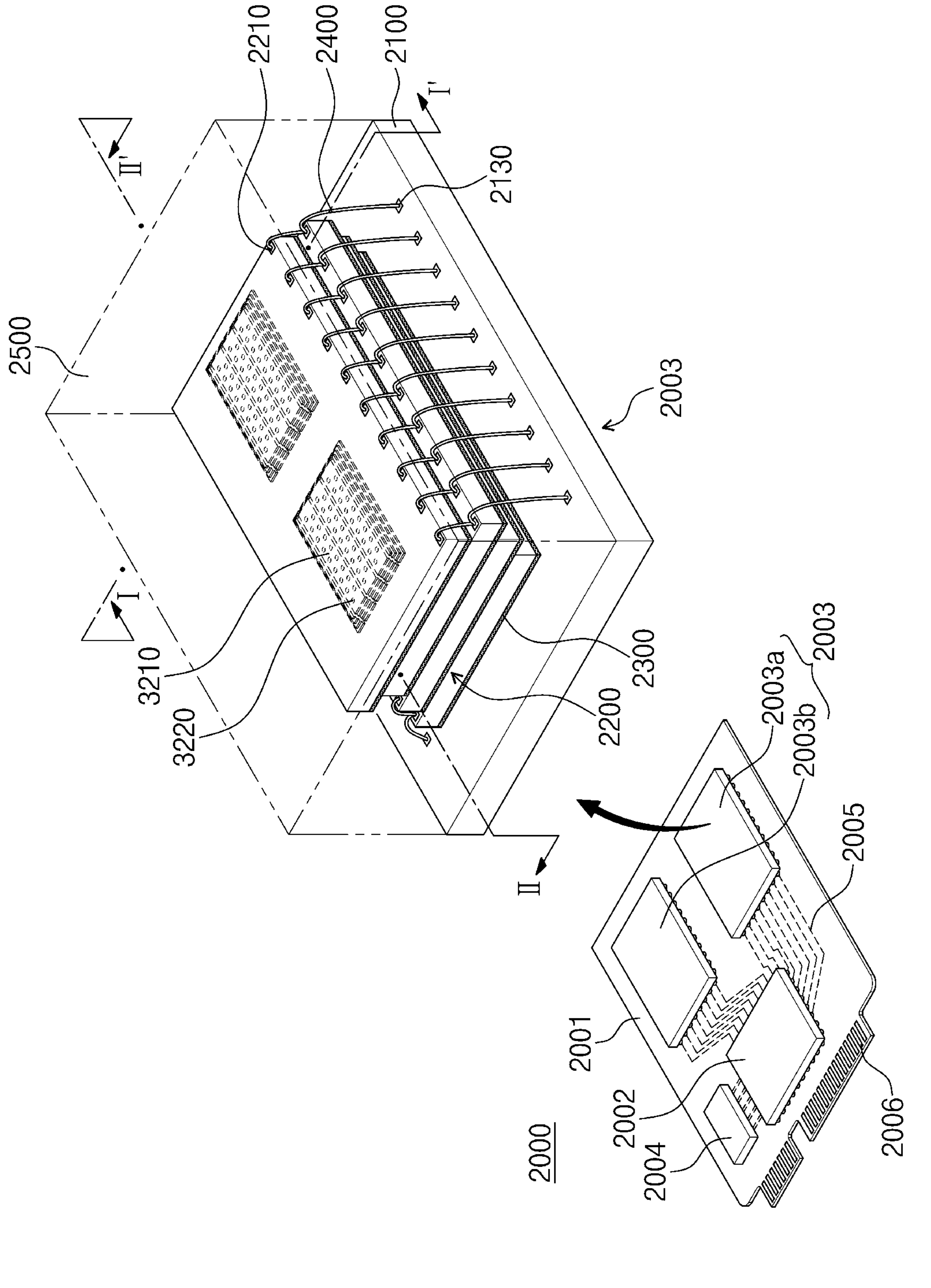
FIG. 2 is a perspective view of an electronic system that includes a semiconductor memory device according to an embodiment of the inventive concept.

FIG. 2 is a perspective view of an electronic system that includes a semiconductor memory device, according to an embodiment of the inventive concept.

Referring to FIG. 2, an electronic system 2000 according to an embodiment of the inventive concept includes a main substrate 2001 and a controller 2002, at least one semiconductor package 2003, and a DRAM 2004 that are mounted on the main substrate 2001. The semiconductor package 2003 and the DRAM 2004 are connected to the controller 2002 through interconnection patterns 2005 that are formed on or in the main substrate 2001.

The main substrate 2001 includes a connector 2006 that includes a plurality of pins coupled to an external host. In the connector 2006, the number and arrangement of the pins depends on a communication interface between the electronic system 2000 and the external host. In an embodiment, the electronic system 2000 communicates with the external host according to an interface, such as one of a universal serial bus (USB), a peripheral component interconnect express (PCI-Express), a serial advanced technology attachment (SATA), a universal flash storage (UFS) M-PHY, etc. In an embodiment, the electronic system 2000 is driven by electric power that is supplied from the external host through the connector 2006. The electronic system 2000 further includes a power management integrated circuit (PMIC) that separately supplies electric power that is received from the external host to the controller 2002 and the semiconductor package 2003.

The controller 2002 controls writing or reading operations on the semiconductor package 2003 and increases the operating speed of the electronic system 2000.

The DRAM 2004 is a buffer memory that relieves technical issues caused by speed differences between the semiconductor package 2003, which serves as a data storage device, and an external host. In an embodiment, the DRAM 2004 in the electronic system 2000 is a cache memory that provides a storage space that temporarily stores data during control operations of the semiconductor package 2003. When the electronic system 2000 includes the DRAM 2004, the controller 2002 further includes a DRAM controller that controls the DRAM 2004, in addition to a NAND controller that controls the semiconductor package 2003.

The semiconductor package 2003 includes first and second semiconductor packages 2003*a* and 2003*b* that are spaced apart from each other. Each of the first and second semiconductor packages 2003*a* and 2003*b* is a semiconductor package that includes a plurality of semiconductor chips 2200. Each of the first and second semiconductor packages 2003*a* and 2003*b* includes a package substrate 2100, the semiconductor chips 2200 disposed on the package substrate 2100, adhesive layers 2300 respectively disposed on bottom surfaces of the semiconductor chips 2200, a connection structure 2400 that electrically connects the semiconductor chips 2200 to the package substrate 2100, and a molding layer 2500 disposed on the package substrate 2100 and that covers the semiconductor chips 2200 and the connection structure 2400.

The package substrate 2100 is a printed circuit board that includes package upper pads 2130. Each of the semiconductor chips 2200 includes an input/output pad 2210. The input/output pad 2210 corresponds to the input/output pad 1101 of FIG. 1. Each of the semiconductor chips 2200 includes gate stacks 3210 and vertical structures 3220. Each of the semiconductor chips 2200 includes a semiconductor memory device that will be described below, according to an embodiment of the inventive concept.

In an embodiment, the connection structure 2400 is a bonding wire that electrically connects the input/output pad 2210 to the package upper pads 2130. In each of the first and second semiconductor packages 2003*a* and 2003*b*, the semiconductor chips 2200 are electrically connected to each other by bonding wires and are electrically connected to the package upper pads 2130 of the package substrate 2100. In an embodiment, the semiconductor chips 2200 in each of the first and second semiconductor packages 2003*a* and 2003*b* are electrically connected to each other by a connection structure that includes through-silicon vias (TSVs), not by the bonding wire connection structure 2400.

In an embodiment, the controller 2002 and the semiconductor chips 2200 are included in a single package. In an embodiment, the controller 2002 and the semiconductor chips 2200 are mounted on a separate interposer substrate that is independent of the main substrate 2001, and are connected to each other through interconnection lines provided in the interposer substrate.

Figure 3:
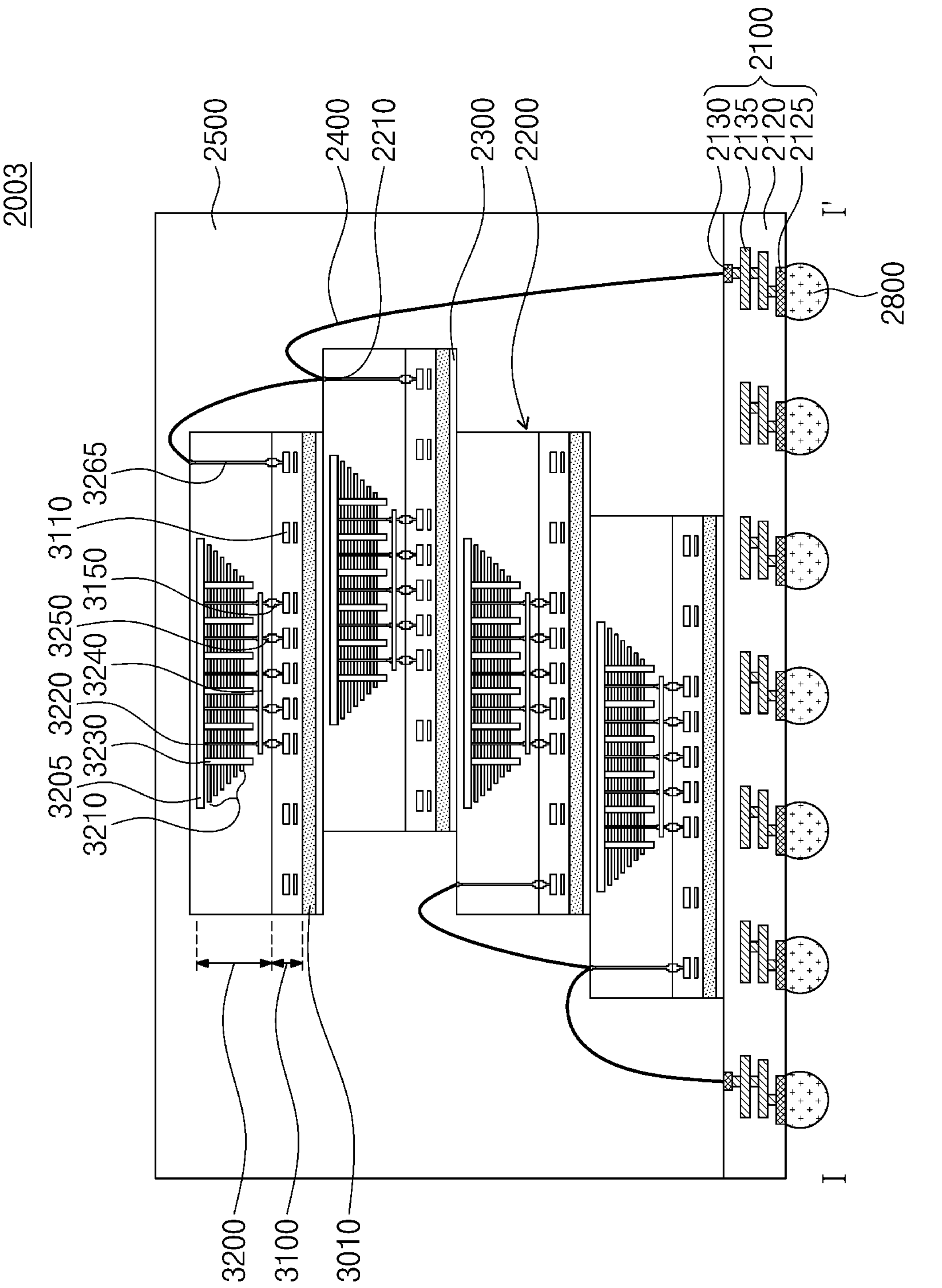
FIGS. 3 and 4 are sectional views that each illustrates a semiconductor package according to an embodiment of the inventive concept.
Figure 4:
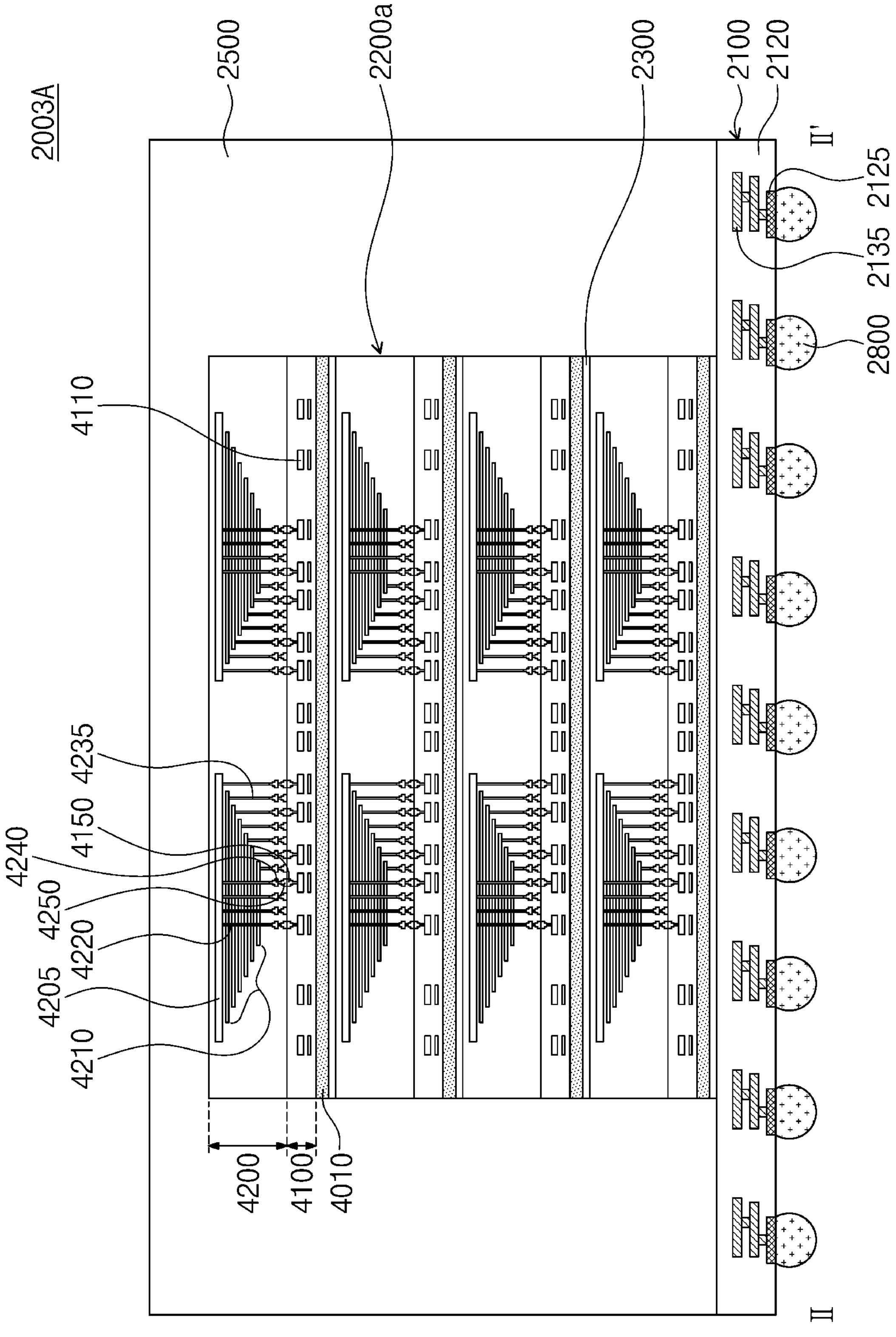

FIGS. 3 and 4 are sectional views that each illustrate a semiconductor package according to an embodiment of the inventive concept. FIGS. 3 and 4 conceptually illustrate two different examples of the semiconductor package of FIG. 2 and are, for example, sectional views taken along a line I-I' of FIG. 2.

Referring to FIG. 3, in an embodiment, the package substrate 2100 of the semiconductor package 2003 is a printed circuit board. The package substrate 2100 includes a package substrate body portion 2120, the package upper pads 2130 (see FIG. 2) disposed on a top surface of the package substrate body portion 2120, lower pads 2125 that are disposed on or exposed through a bottom surface of the package substrate body portion 2120, and internal lines 2135 that are provided in the package substrate body portion 2120 to electrically connect the package upper pads 2130 to the lower pads 2125. The lower pads 2125 are connected to the interconnection patterns 2005 of the main substrate 2001 of the electronic system 2000 through conductive connecting portions 2800, as shown in FIG. 2.

Each of the semiconductor chips 2200 includes a semiconductor substrate 4010 and first and second structures 3100 and 3200 that are sequentially stacked on the semiconductor substrate 3010. The first structure 3100 includes a peripheral circuit region in which peripheral lines 3110 are provided. The second structure 3200 includes a source structure 3205, a stack 3210 disposed on the source structure 3205, vertical structures 3220 that penetrate the stack 3210, bit lines 3240 electrically connected to the vertical structures 3220. The second structure 3200 further includes separation structures 3230 that will be described in more detail below.

The first structure 3100 includes first junction structures 3150 and the second structure 3200 includes second junction structures 3250. Portions of the first and second junction structures 3150 and 3250 that are bonded to each other may be formed of, for example, copper (Cu). Each of the semiconductor chips 2200 further includes the input/output pads 2210 (see FIG. 2) that are electrically connected to the peripheral lines 3110 of the first structure 3100. Each of the semiconductor chips 2200 includes an input/output pad 2210 and an input/output connection plug 3265. The input/output connection plug 3265 connects the input/output pad 2210 and one of the second junction structures 3250.

Referring to FIG. 4, in an embodiment, in a semiconductor package 2003A, each of the semiconductor chips 2200*a* includes a semiconductor substrate 4010, a first structure 4100 disposed on the semiconductor substrate 4010, and a second structure 4200 disposed on the first structure 4100 and is wafer-bonded with the first structure 4100.

The first structure 4100 includes a peripheral circuit region in which a peripheral line 4110 and first junction structures 4150 are provided. The second structure 4200 includes a source structure 4205, a stack 4210 between the source structure 4205 and the first structure 4100, vertical structures 4220 that penetrate the stack 4210, and second junction structures 4250 electrically connected to the vertical structures 4220 and the word lines WL (see FIG. 1) of the stack 4210. For example, the second junction structures 4250 are electrically connected to the vertical structures 4220 and the word lines WL (see FIG. 1) respectively through bit lines 4240 that are electrically connected to the vertical structures 4220, and cell contact plugs 4235 that are electrically connected to the word lines WL (see FIG. 1). The first junction structures 4150 of the first structure 4100 and the second junction structures 4250 of the second structure 4200 are in contact with each other and are bonded to each other. Portions of the first and second junction structures 4150 and 4250 that are bonded to each other may be formed of, for example, copper (Cu). Each of the semiconductor chips 2200*a* further includes the input/output pads 2210 (see FIG. 2) that are electrically connected to the peripheral lines 4110 of the first structure 4100.

The semiconductor chips 2200 of FIG. 3 and the semiconductor chips 2200*a* of FIG. 4 are connected to each other by the connection structures 2400 (see FIG. 2) that are provided in the form of bonding wires. However, in an embodiment, semiconductor chips that are provided in each semiconductor package are electrically connected to each other by a connection structure that includes through-silicon vias (TSVs).

The first structure 3100 or 4100 of FIG. 3 or 4 corresponds to a peripheral circuit structure in embodiments to be described below, and the second structure 3200 or 4200 of FIG. 3 or 4 corresponds to a cell array structure in embodiments to be described below.

Figure 5:
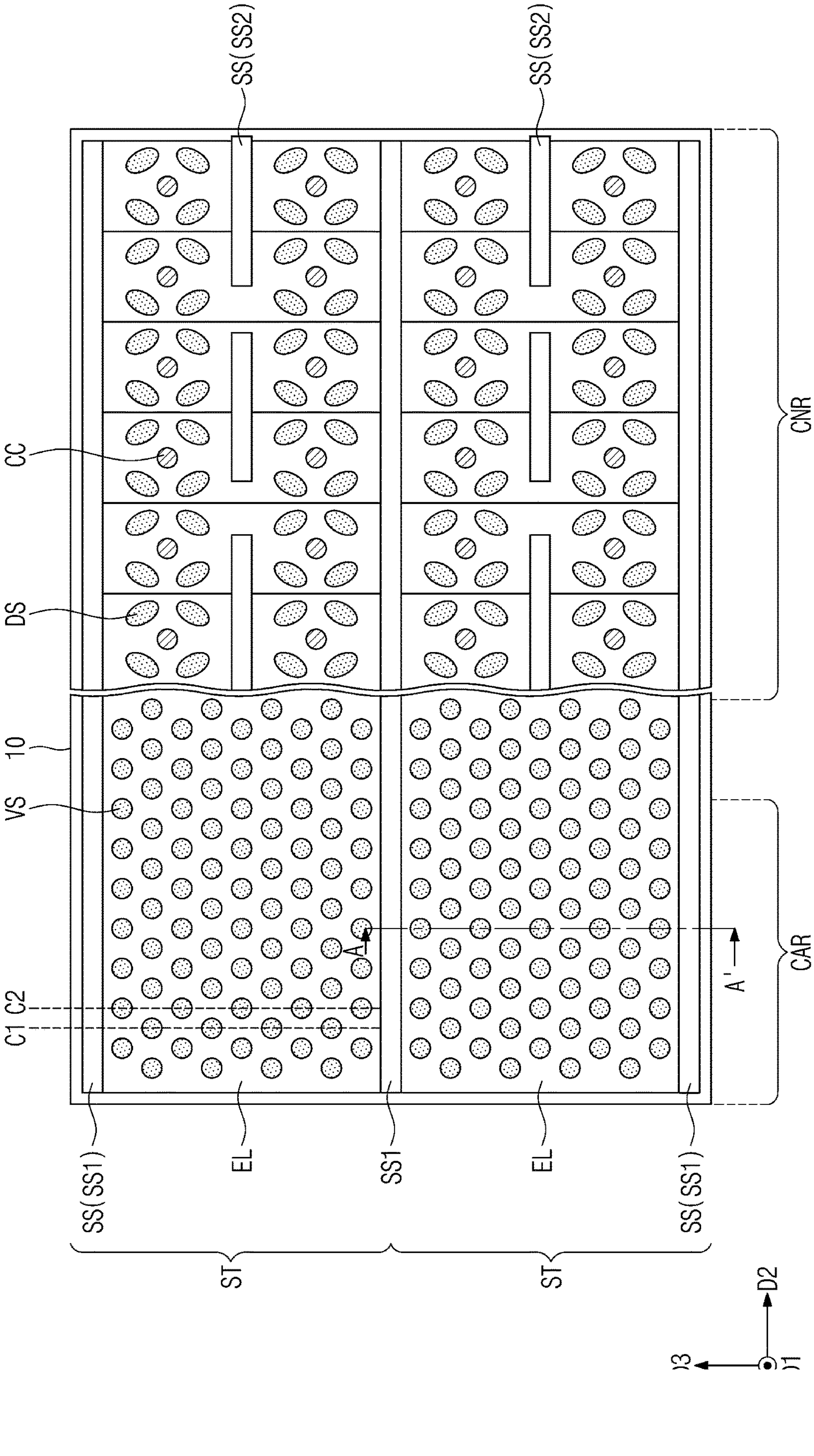
FIG. 5 is a plan view of a semiconductor memory device according to an embodiment of the inventive concept.
Figure 6:
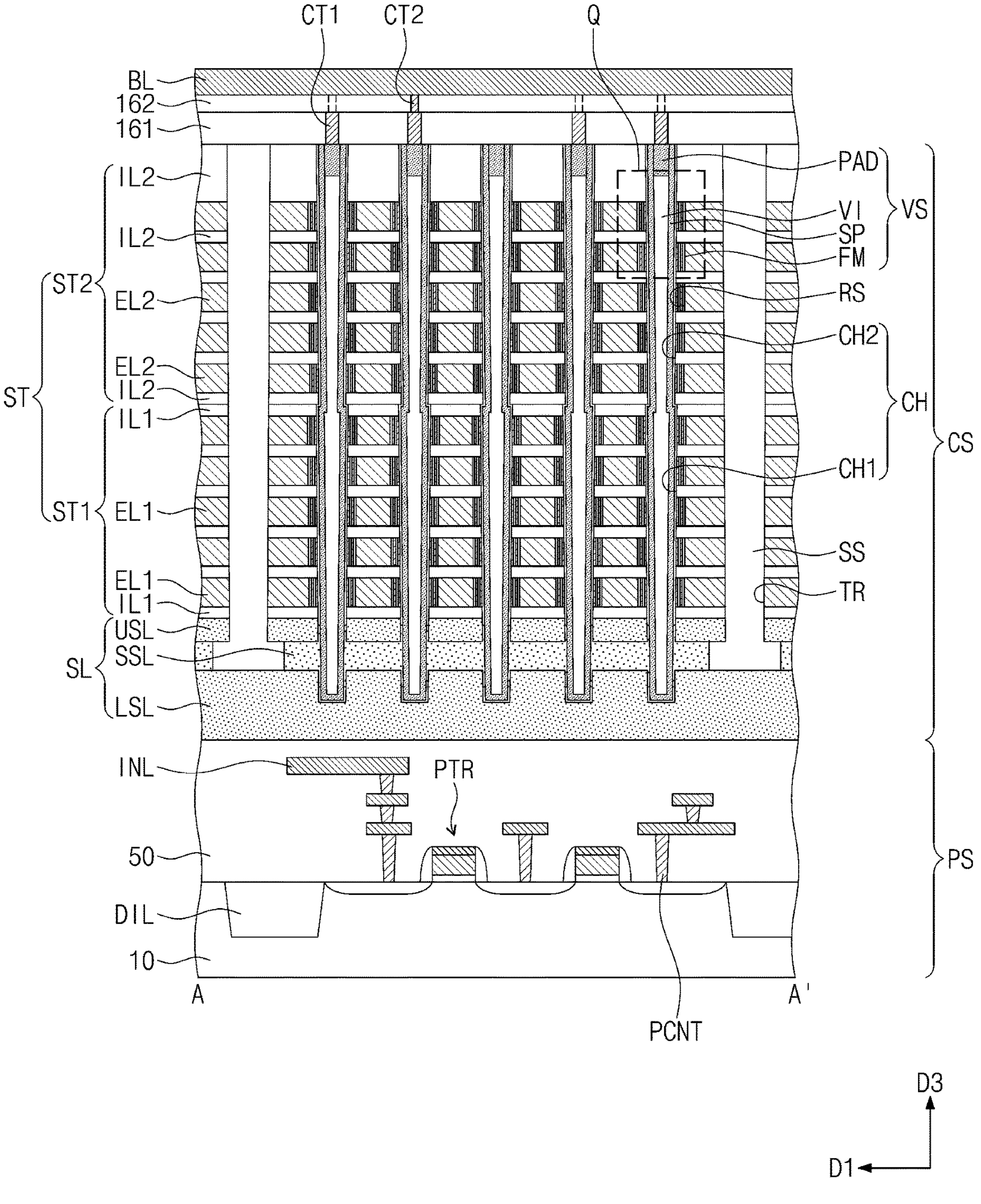
FIG. 6 is a sectional view taken along a line A-A' of FIG. 5.
Figure 7:
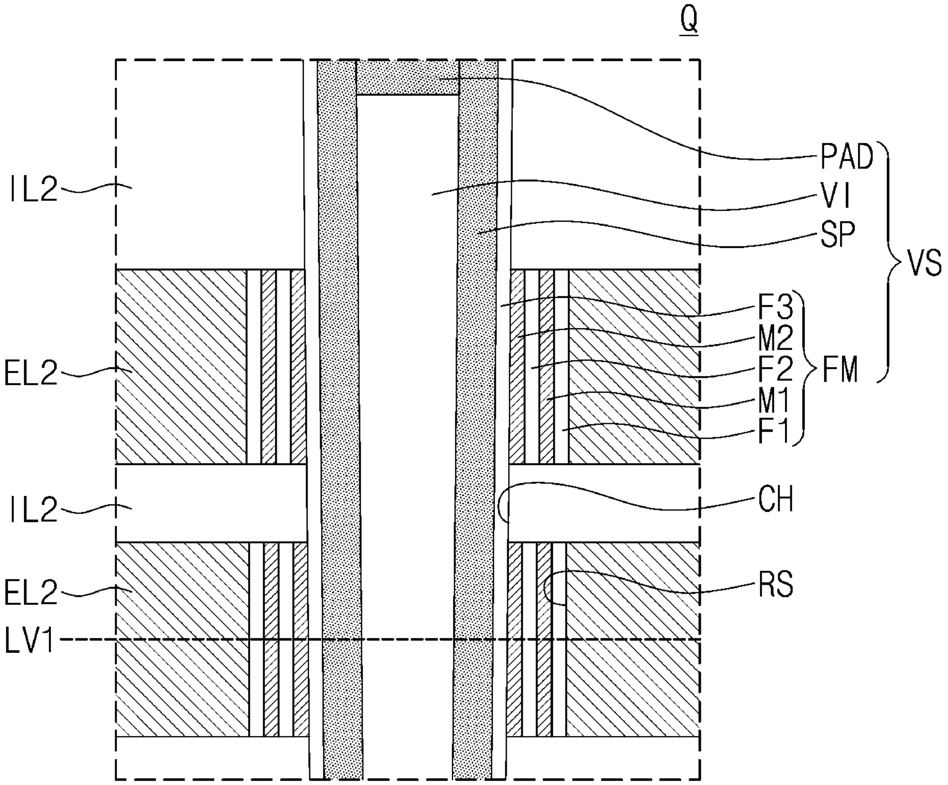
FIG. 7 is an enlarged sectional view of a portion 'Q' of FIG. 6.
Figure 8:
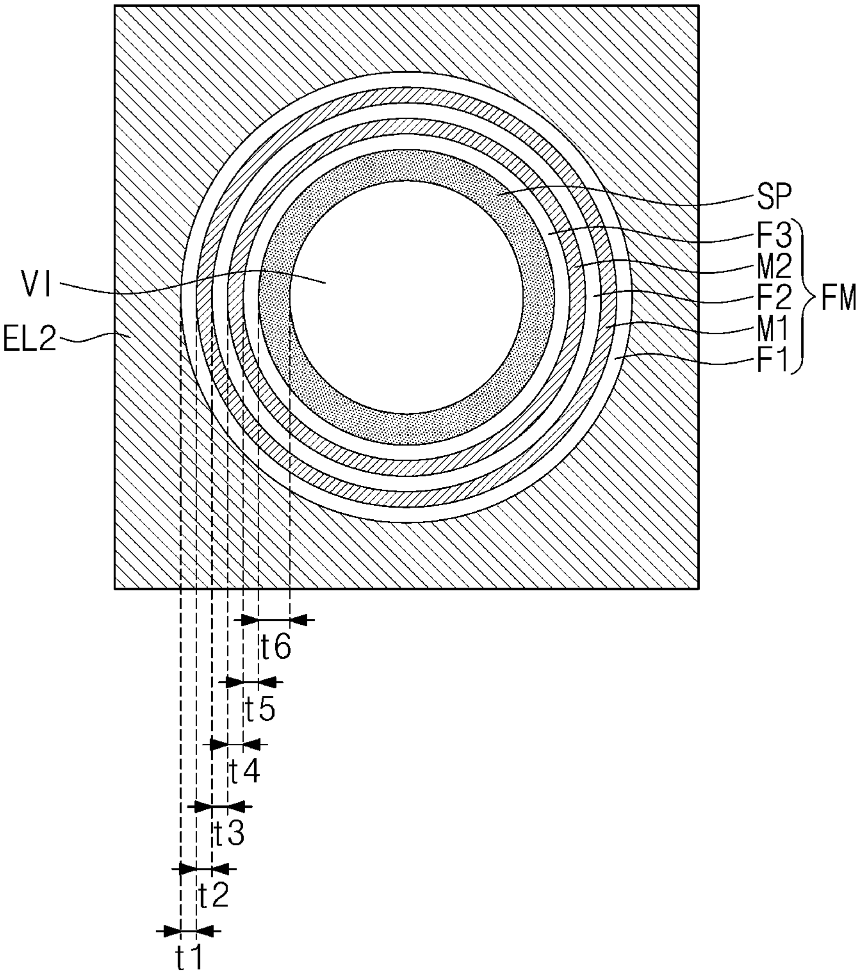
FIG. 8 is a sectional view taken at a first level LV1 of FIG. 6.

FIG. 5 is a plan view of a semiconductor memory device according to an embodiment of the inventive concept. FIG. 6 is a sectional view taken along a line A-A' of FIG. 5. FIG. 7 is an enlarged sectional view of a portion 'Q' of FIG. 6. FIG. 8 is a sectional view taken at a first level LV1 of FIG. 7.

Referring to FIGS. 5 to 8, in an embodiment, a peripheral circuit structure PS that includes peripheral transistors PTR is disposed on a first substrate 10. A cell array structure CS that includes gate stacks ST is disposed on the peripheral circuit structure PS. The first substrate 10 may be one of a silicon substrate, a silicon-germanium substrate, a germanium substrate, or a single-crystalline epitaxial layer grown on a single-crystalline silicon substrate. The first substrate 10 includes active regions that are defined by a device isolation layer DIL. The peripheral transistors PTR may constitute a decoder circuit, a page buffer, a logic circuit, or the like, as described above.

The peripheral circuit structure PS includes lower interconnection lines INL disposed on the peripheral transistors PTR and a first interlayer insulating layer 50 that covers the peripheral transistors PTR and the lower interconnection lines INL. A peripheral contact PCNT is disposed between the lower interconnection line INL and the peripheral transistor PTR to electrically connect them to each other. The first interlayer insulating layer 50 includes a plurality of insulating layers that are stacked on the first substrate 10. For example, the first interlayer insulating layer 50 includes one or more of a silicon oxide layer, a silicon nitride layer, a silicon oxynitride layer, and/or a low-k dielectric layer.

The cell array structure CS is disposed on the first interlayer insulating layer 50 of the peripheral circuit structure PS. Hereinafter, the cell array structure CS will be described in more detail. A second substrate SL is disposed on the first interlayer insulating layer 50. The second substrate SL supports the gate stacks ST, which are disposed thereon.

The second substrate SL includes a lower semiconductor layer LSL, a source semiconductor layer SSL, and an upper semiconductor layer USL that are sequentially stacked. Each of the lower semiconductor layer LSL, the source semiconductor layer SSL, and the upper semiconductor layer USL is formed of or includes at least one semiconductor material, such as silicon (Si), germanium (Ge), silicon germanium (SiGe), gallium arsenic (GaAs), indium gallium arsenic (InGaAs), aluminum gallium arsenic (AlGaAs), or mixtures thereof. Each of the lower semiconductor layer LSL, the source semiconductor layer SSL, and the upper semiconductor layer USL may have a single crystalline structure, an amorphous structure, and/or a polycrystalline structure. For example, each of the lower semiconductor layer LSL, the source semiconductor layer SSL, and the upper semiconductor layer USL is an n-type doped poly-silicon layer. The lower semiconductor layer LSL, the source semiconductor layer SSL, and the upper semiconductor layer USL may have impurity concentrations different from each other. For example, the impurity concentration of the source semiconductor layer SSL is higher than the impurity concentration of each of the lower and upper semiconductor layers LSL and USL.

The second substrate SL includes a cell array region CAR and a connection region CNR, as shown in FIG. 5. The cell array region CAR overlaps with a center of the second substrate SL. The connection region CNR is disposed adjacent to at least one side of the cell array region CAR. The lower semiconductor layer LSL and the upper semiconductor layer USL are connected to each other through the source semiconductor layer SSL.

Each of the gate stacks ST includes electrodes EL that are stacked in a direction perpendicular to the second substrate SL, such as a third direction D3. In an embodiment, the gate stack ST includes a lower gate stack ST1 and an upper gate stack ST2 disposed on the lower gate stack ST1, and the electrodes EL include first electrodes EL1 and second electrodes EL2. The description that follows will refer to an example in which two gate stacks are provided, but embodiments are not necessarily limited thereto, and in an embodiment, three or more gate stacks can be provided. The lower gate stack ST1 includes first cell insulating layers IL1 and first electrodes EL1 that are alternately stacked. The upper gate stack ST2 includes second cell insulating layers IL2 and second electrodes EL2 that are alternately stacked. The first cell insulating layers IL1 and the first electrodes EL1 of the lower gate stack ST1 are alternately stacked in the third direction D3. The second cell insulating layers IL2 and the second electrodes EL2 of the upper gate stack ST2 are alternately stacked in the third direction D3. The uppermost second cell insulating layer IL2 in the upper gate stack ST2 is thicker than the remaining second cell insulating layers IL2 and the first cell insulating layers IL1 that are located below. The uppermost first cell insulating layer IL1 in the lower gate stack ST1 is in contact with the lowermost second cell insulating layer IL2 in the upper gate stack ST2.

The gate stack ST extends from the cell array region CAR to the connection region CNR. The gate stack ST has a stepwise structure on the connection region CNR, as shown in FIGS. 3 and 4. The stepwise structure of the gate stack ST height that decreases with increasing distance from the cell array region CAR. For example, the stepwise structure of the gate stack ST has a height that decreases along a second direction D2 that extends away from the cell array region CAR. End portions of the electrodes EL are exposed due to the stepwise structure, and, for example, cell contact plugs CC are connected to the end portions of the electrodes EL.

Among the electrodes EL of the gate stack ST, the lowermost pair of the electrodes EL are the gate electrodes of the lower transistors LT1 and LT2 described with reference to FIG. 1, and the uppermost pair of the electrodes EL are the gate electrodes of the upper transistors UT1 and UT2 described with reference to FIG. 1. The remaining electrodes EL are the word lines.

Each of the electrodes EL is formed of or includes at least one of a doped semiconductor material, such as doped silicon, a metal, such as tungsten, copper, or aluminum, a conductive metal nitride, such as titanium nitride or tantalum nitride, or a transition metal, such as titanium or tantalum. Each of the first and second cell insulating layers IL1 and IL2 is formed of or includes silicon oxide.

A plurality of vertical structures VS that penetrate the gate stack ST are disposed on the cell array region CAR. For example, as shown in FIG. 5, four vertical structures VS are arranged in a first direction D1 to form a first column C1, and five vertical structures VS are arranged in the first direction D1 to form a second column C2. The first and second columns C1 and C2 are repeatedly and alternately arranged in the second direction D2, which crosses the first direction D1. A diameter of each of the vertical structures VS gradually decreases with decreasing distance from the second substrate SL. In an embodiment, the vertical structures VS include a stepped portion that is located near a boundary between the lower and upper gate stacks ST1 and ST2 and has a discontinuous diameter.

Dummy structures DS that penetrate the gate stack ST are disposed on the connection region CNR. The dummy structures DS penetrate the stepwise structure of the gate stack ST. When viewed in a plan view, a size, such as the largest diameter, of each of the dummy structures DS is greater than a size, such as the largest diameter, of each of the vertical structures VS.

The vertical structures VS are disposed in channel holes CH that penetrate the gate stack ST. Each of the vertical structures VS includes a data storage structure FM, a vertical channel pattern SP, and a gapfill insulating pattern VI. The vertical channel pattern SP is interposed between the data storage structure FM and the gapfill insulating pattern VI. A conductive pad PAD is disposed in an upper portion of each of the vertical structures VS. The vertical channel pattern SP is spaced apart from the electrodes EL with the data storage structure FM interposed therebetween.

The data storage structure FM is formed of or includes a data storing element that includes a ferroelectric material. The data storage structure FM has a structure formed repeated and alternating ferroelectric and conductive patterns. Since the ferroelectric material is used as the data storing element of the data storage structure FM, a fast semiconductor memory device can be realized that can be operated with low power. In each memory cell transistor MCT, a voltage difference between one of the electrodes EL and a channel region can be adjusted to change a polarization of a dipole of the ferroelectric material, and this can perform a data writing or erasing operation on each memory cell transistor MCT. For example, the ferroelectric pattern is disposed between the electrodes EL and the vertical channel pattern SP. In each memory cell transistor MCT, the ferroelectric pattern has a non-centrosymmetric charge distribution and thereby has a spontaneous dipole, such as a spontaneous polarization. The ferroelectric pattern may have a remnant polarization that is caused by the dipole even when there is no external electric field. Furthermore, a polarization direction can be switched by an external electric field. For example, the ferroelectric pattern may have a positive or negative polarization state, and the polarization state can be changed by an electric field exerted on the ferroelectric pattern during a program operation. Even when power is interrupted, the polarization state of the ferroelectric pattern can be maintained, and thus, the semiconductor memory device can be operated as a nonvolatile memory device. The ferroelectric pattern is formed of or includes at least one of a hafnium-containing dielectric materials, such as $HfO_2$, Si-doped $HfO_2$ ($HfSiO_2$), Al-doped $HfO_2$ ($HfAlO_2$), Zr-doped $HfO_2$ ($HfZrO_2$), HfSiON, HfZnO, $ZrO_2$, $ZrSiO_2$, $HfZrSiO_2$, ZrSiON, LaAlO, $HfDyO_2$, or $HfScO_2$.

For example, the data storage structure FM includes first ferroelectric patterns F1 and first conductive patterns M1. The first ferroelectric patterns F1 is disposed on side surfaces of the electrodes EL. The first ferroelectric patterns F1 are spaced apart from each other in the third direction D3, with the first and second cell insulating layers IL1 and IL2 interposed therebetween. When viewed in a plan view, the first ferroelectric pattern F1 has a ring-shaped pattern that encloses the vertical channel pattern SP, as shown in FIG. 8. For example, the ring-shaped first ferroelectric patterns F1 is spaced apart from each other in an extension direction of the vertical channel pattern SP.

The first conductive patterns M1 are disposed between the first ferroelectric patterns F1 and the vertical channel pattern SP. The first conductive patterns M1 are disposed on side surfaces of the first ferroelectric patterns F1, respectively. The first conductive patterns M1 are spaced apart from each other in the third direction D3, with the first and second cell insulating layers IL1 and IL2 interposed therebetween. When viewed in a plan view, the first conductive pattern M1 has a ring-shaped pattern that encloses the vertical channel pattern SP, as shown in FIG. 8. For example, the ring-shaped first conductive patterns M1 are spaced apart from each other in the extension direction of the vertical channel pattern SP.

The first conductive patterns M1 are formed of or include at least one metallic material or conductive metal nitride material. For example, the first conductive patterns M1 are formed of or include at least one of TiN, TaN, WN, W, Mo, Nb, or doped or undoped poly silicon. The first conductive patterns M1 has an electric resistivity that is equal to or lower than the electrodes EL. For example, the first conductive patterns M1 are formed of or include the same material as the electrodes EL.

The data storage structure FM includes second ferroelectric patterns F2 and second conductive patterns M2. The second ferroelectric patterns F2 are disposed between the first conductive patterns M1 and the vertical channel pattern SP, and the second conductive patterns M2 are disposed between the second ferroelectric patterns F2 and the vertical channel pattern SP. The second ferroelectric patterns F2 are formed of the same material as the first ferroelectric patterns F1 and have a ring shape, similar to the first ferroelectric patterns F1. The second conductive patterns M2 are formed of the same material as the first conductive patterns M1 and have a ring shape, similar to the first conductive patterns M1. Each of the first and second conductive patterns M1 and M2 are in an electrically-floated state. For example, each of the first and second conductive patterns M1 and M2 is spaced apart from an adjacent conductive layer or conductive pattern with a ferroelectric layer or an insulating layer interposed therebetween.

A third ferroelectric pattern F3 is disposed between the second conductive patterns M2 and the vertical channel pattern SP. The third ferroelectric pattern F3 is formed of or includes the same material as the first and second ferroelectric patterns F1 and F2. The third ferroelectric pattern F3 extends along a side surface of the vertical channel pattern SP and is connected in common to the second conductive patterns M2. The third ferroelectric pattern F3 has an outer side surface that is in contact with the first and second cell insulating layers IL1 and IL2, and an inner side surface that is in contact with an outer side surface of the vertical channel pattern SP.

As shown in FIG. 7, the third ferroelectric pattern F3 is disposed in the channel hole CH, and the first and second ferroelectric patterns F1 and F2 and the first and second conductive patterns M1 and M2 are disposed in a recess region RS that horizontally extends from the channel hole CH. In an embodiment, two pairs of the ferroelectric and conductive patterns are disposed in the recess region RS, but embodiments are not necessarily limited thereto, and in other embodiments, three or more pairs of the ferroelectric and conductive patterns can be provided in the recess region RS. In an embodiment, the number of the ferroelectric patterns that are disposed between each electrode EL and the vertical channel pattern SP is greater than the number of the conductive patterns. For example, the number of the ferroelectric patterns that are disposed between each electrode EL and the vertical channel pattern SP is one more than the number of the conductive patterns.

A thickness t1 of the first ferroelectric pattern F1 is equal to a thickness t3 of the second ferroelectric pattern F2, but embodiments of the inventive concept are not necessarily limited to this example. A thickness t2 of the first conductive pattern M1 is equal to a thickness t4 of the second conductive pattern M2, but the inventive concept is not limited to this example. A thickness t5 of the third ferroelectric pattern F3 is equal to the thickness t1 of the first ferroelectric pattern F1 and the thickness t3 of the second ferroelectric pattern F2, but embodiments are not necessarily limited thereto, and in an embodiment, it is greater than the thickness t1 of the first ferroelectric pattern F1 or the thickness t3 of the second ferroelectric pattern F2. The thickness of each of the first and second ferroelectric patterns F1 and F2 is equal to the thickness of each of the first and second conductive patterns M1 and M2, but embodiments are not necessarily limited thereto, and in an embodiment, it is less than the thickness of each of the first and second conductive patterns M1 and M2. The thickness t1 of the first ferroelectric pattern F1, the thickness t3 of the second ferroelectric pattern F2, the thickness t2 of the first conductive pattern M1, the thickness t4 of the second conductive pattern M2, and the thickness t5 of the third ferroelectric pattern F3 are less than a thickness t6 of the vertical channel pattern SP.

The vertical channel pattern SP is formed of or includes at least one semiconductor material, such as silicon (Si) or germanium (Ge). In an embodiment, the vertical channel pattern SP are formed of a doped or undoped (i.e., intrinsic) semiconductor material. For example, the vertical channel pattern SP is formed of or includes poly silicon. In an embodiment, the vertical channel pattern SP is formed of or includes an oxide semiconductor material, such as IGOZ. The vertical channel pattern SP are channel regions of transistors that constitute a NAND cell string.

The conductive pad PAD covers a top surface of the vertical channel pattern SP and a top surface of the gapfill insulating pattern VI. The conductive pad PAD is formed of or includes at least one doped semiconductor material and/or metal. A first contact plug CT1 is electrically connected to the vertical channel pattern SP through the conductive pad PAD.

The source semiconductor layer SSL is in direct contact with a lower portion of each of the vertical channel patterns SP. The source semiconductor layer SSL electrically connect the vertical channel patterns SP on the cell array region CAR to each other. For example, the vertical channel patterns SP of the vertical structures VS are electrically connected to the source semiconductor layer SSL. A common source voltage can be applied to the source semiconductor layer SSL. The source semiconductor layer SSL horizontally extends and penetrates a lower portion of the third ferroelectric pattern F3 and is in contact with the vertical channel patterns SP. For example, the lower portion of the third ferroelectric pattern F3 is separated from an upper portion of the third ferroelectric pattern F3 with the source semiconductor layer SSL interposed therebetween. The gapfill insulating pattern VI is formed of or includes at least one of silicon oxide and/or silicon oxynitride.

Each of the dummy structures DS includes the data storage structure FM, the vertical channel pattern SP, and the gapfill insulating pattern VI, similar to the vertical structures VS described above. However, the dummy structures DS are not channel regions of the memory cell transistors, unlike the vertical structures VS. The dummy structures DS are not electrically connected to the bit lines BL. For example, the dummy structures DS are non-functional components in a circuit. The dummy structures DS are used as a pillar, such as a supporter, that physically supports the stepwise structure of the gate structure ST.

A plurality of separation structures SS are provided that penetrate the gate stack ST. The separation structures SS are disposed in trenches TR that penetrate the gate stack ST. The trenches TR expose a top surface of the lower semiconductor layer LSL. The separation structures SS extend in the second direction D2 and are parallel to each other. When viewed in a plan view, each of the separation structures SS is a line- or bar-shaped pattern that extends in the second direction D2. In an embodiment, the separation structures SS include first separation structures SS1 that extend from the cell array region CAR into the connection region CNR and horizontally divide each of the electrode EL into a plurality of electrodes EL. The first separation structures SS1 extend into regions between the gate stacks ST and define each of the gate stacks ST. In an embodiment, the first separation structures SS1 extend into a space between the gate stacks ST, as shown in FIG. 5.

The separation structures SS further include second separation structures SS2 that are disposed in the connection region CNR and have bar-shaped structures spaced apart from each other in the second direction D2. The second separation structures SS2 are disposed in each of the gate stacks ST. The separation structures SS are formed of or include at least one insulating material, such as silicon oxide.

A second interlayer insulating layer 161, a third interlayer insulating layer 162, and the bit lines BL are sequentially disposed on the gate stack ST. First contact plugs CT1 are disposed in the second interlayer insulating layer 161 and are connected to the vertical structures VS. Second contact plugs CT2 are disposed in the third interlayer insulating layer 162 and connect the first contact plugs CT1 to the bit lines BL. The second and third interlayer insulating layers 161 and 162 are formed of or include silicon oxide. The bit lines BL extend in the first direction D1 and are parallel to each other. A plurality of upper interconnection lines are disposed on the cell contact plugs CC. In addition, the bit lines BL and the upper interconnection lines are electrically connected to the lower interconnection lines INL of the peripheral circuit structure PS through penetration contacts.

As shown in FIG. 6, the gate stack ST is disposed between the bit lines BL and the peripheral circuit structure PS, but embodiments are not necessarily limited thereto, and in an embodiment, the bit lines BL and the upper interconnection lines are disposed between the gate stack ST and the peripheral circuit structure PS. For example, the peripheral circuit structure PS and the cell array structure CS have the connection structure described with reference to FIGS. 3 and 4.

According to an embodiment of the inventive concept, owing to the repeatedly-stacked structure of the ferroelectric and conductive patterns, a ratio of an orthorhombic phase portion to the ferroelectric pattern is increased. Thus, a ferroelectric property of the ferroelectric pattern can be enhanced. In addition, due to the repeatedly-stacked structure of the ferroelectric and conductive patterns, an electric field can be concentrated on the ferroelectric pattern when the semiconductor memory device is operated, and this lowers an operating voltage and reduces a strength of a depolarization field.

Figure 9:
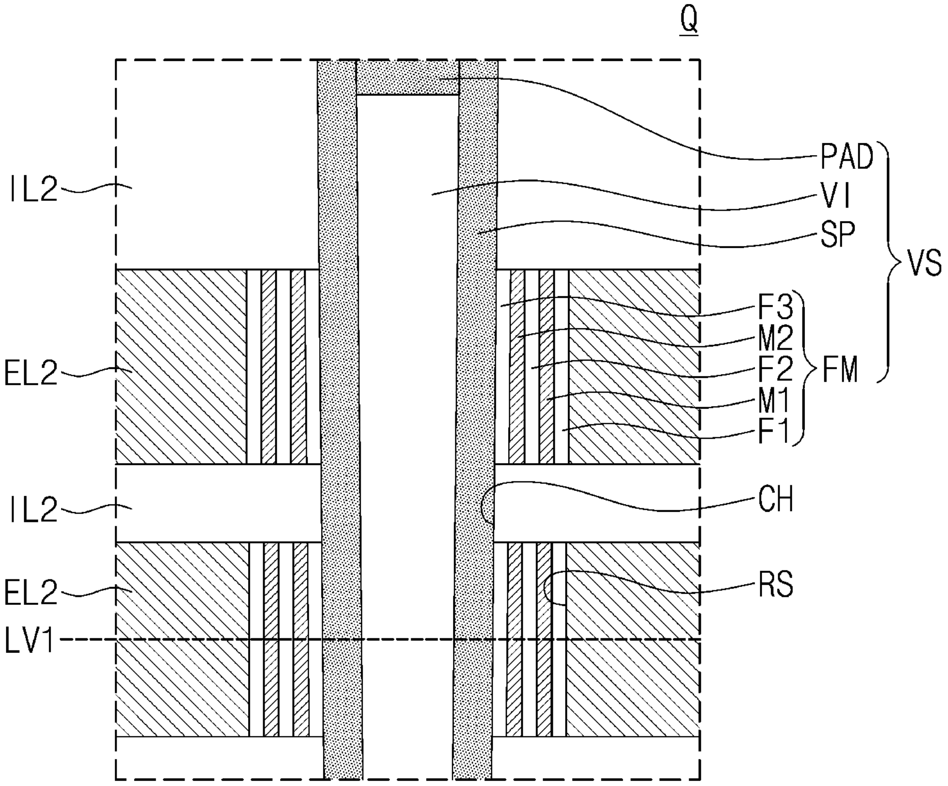
FIG. 9 is an enlarged sectional view of a portion 'Q' of FIG. 6 of a semiconductor memory device, according to an embodiment of the inventive concept.

FIG. 9 is an enlarged sectional view of a portion 'Q' of FIG. 6 of a semiconductor memory device, according to an embodiment of the inventive concept. For concise description, a previously described element may be identified by a similar or identical reference number without repeating an overlapping description thereof.

Referring to FIG. 9, in an embodiment, the third ferroelectric patterns F3 are disposed between the second conductive patterns M2 and the vertical channel pattern SP. The third ferroelectric patterns F3 are spaced apart from each other in the third direction D3 with the first and second cell insulating layers IL1 and IL2 interposed therebetween. Accordingly, a plurality of data storage structures FM are spaced apart from each other along the side surface of the vertical channel pattern SP.

FIGS. 10, 11, 12, 14, 16, and 17 are sectional views taken along the line A-A' of FIG. 5 that illustrate a method of fabricating a semiconductor device according to an embodiment of the inventive concept. FIG. 13 is an enlarged sectional view of a portion 'P' of FIG. 12. FIG. 15 is an enlarged sectional view of a portion 'R' of FIG. 14.

Figure 10:
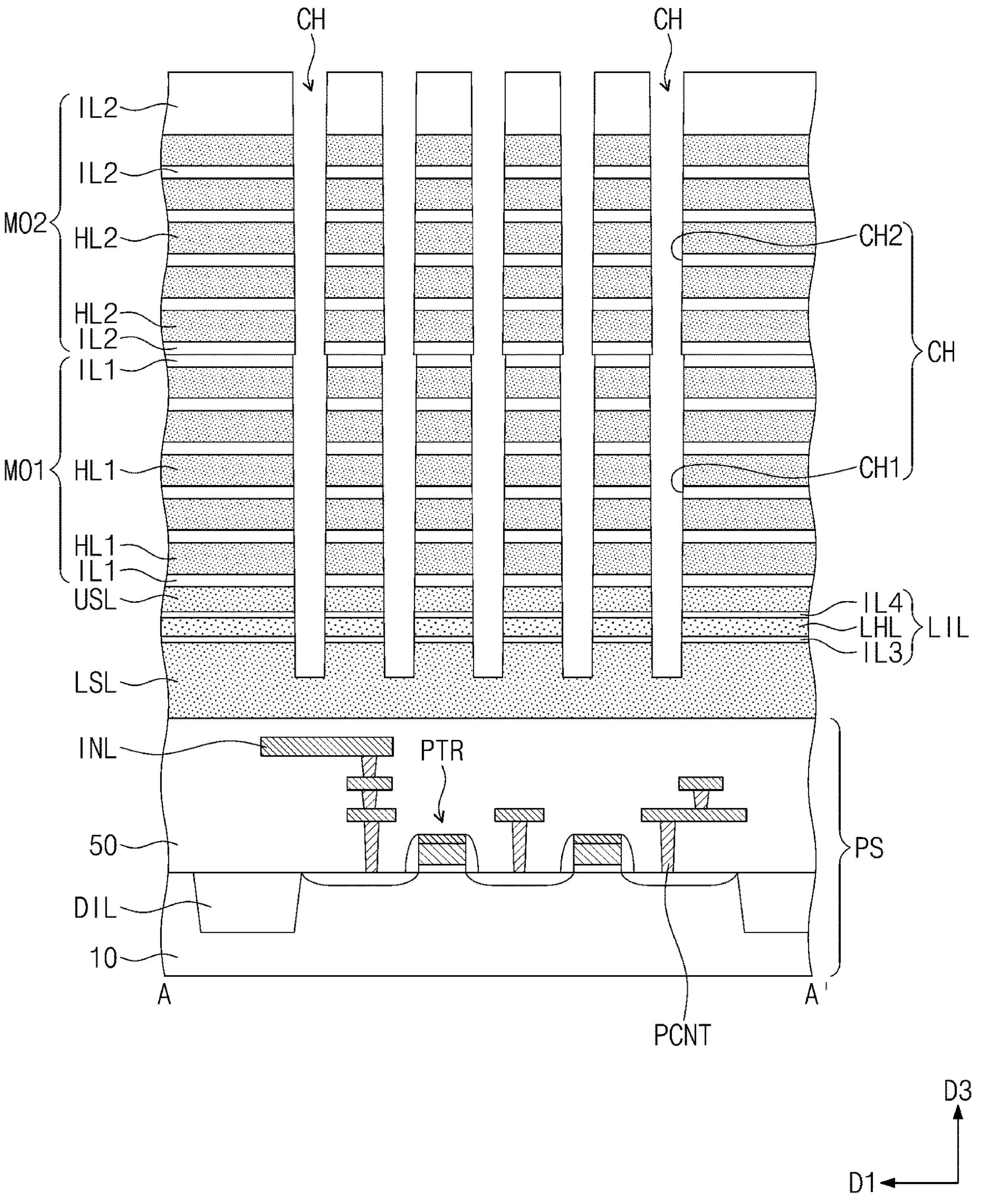
FIGS. 10, 11, 12, 14, 16, and 17 are sectional views taken along the line A-A' of FIG. 5 that illustrate a method of fabricating a semiconductor device according to an embodiment of the inventive concept.

Referring to FIG. 10, in an embodiment, the peripheral circuit structure PS is formed on the first substrate 10. The formation of the peripheral circuit structure PS includes forming the peripheral transistors PTR on the first substrate 10 and forming the lower interconnection lines INL on the peripheral transistors PTR. The formation of the peripheral transistors PTR includes forming the device isolation layer DIL on the first substrate 10 to define active regions, forming a gate insulating layer and a gate electrode on the active regions, and injecting impurities into the active regions to form source/drain regions. The first interlayer insulating layer 50 is formed to cover the peripheral transistors PTR and the lower interconnection lines INL.

The lower semiconductor layer LSL is formed on the first interlayer insulating layer 50. The lower semiconductor layer LSL is formed of or includes at least one semiconductor material, such as polysilicon. An insulating structure LIL is formed on the lower semiconductor layer LSL. The formation of the insulating structure LIL includes sequentially forming a lower insulating layer IL3, a lower sacrificial layer LHL, and an upper insulating layer IL4 on the lower semiconductor layer LSL. The lower and upper insulating layers IL3 and IL4 are formed of or include silicon oxide, and the lower sacrificial layer LHL is formed of or includes silicon nitride or silicon oxynitride.

The upper semiconductor layer USL is conformally formed on the insulating structure LIL. The upper semiconductor layer USL is formed of or includes at least one semiconductor material, such as polysilicon.

A first mold structure MO1 is formed on the upper semiconductor layer USL. For example, the first mold structure MO1 is formed by alternately stacking the first cell insulating layers IL1 and first sacrificial layers HL1 on the upper semiconductor layer USL. The first cell insulating layer IL1 is formed as the lowermost layer of the first mold structure MO1. The first cell insulating layers IL1 and the first sacrificial layers HL1 can be deposited using one of a thermal chemical vapor deposition (thermal CVD) process, a plasma-enhanced CVD process, a physical CVD process, or an atomic layer deposition (ALD) process. The first cell insulating layers IL1 are formed of or includes silicon oxide, and the first sacrificial layers HL1 are formed of or include silicon nitride or silicon oxynitride.

First channel holes CH1 are formed that penetrate the first mold structure MO1 and the insulating structure LIL. The first channel holes CH1 are formed by an anisotropic etching process. The anisotropic etching process is one of a plasma etching process, a reactive ion etching (RIE) process, an inductively-coupled plasma reactive ion etching (ICP-RIE) process, or an ion beam etching (IBE) process. Lower portions of the first channel holes CH1 are formed in the lower semiconductor layer LSL. First sacrificial patterns are formed that fill the first channel holes CH1. The first sacrificial patterns are formed of or include a material that has an etch selectivity with respect to the first cell insulating layers IL1 and the first sacrificial layers HL1. For example, the first sacrificial patterns are formed of or include poly silicon.

A second mold structure MO2 is formed on the first mold structure MO1. The second mold structure MO2 is formed by alternately depositing the second cell insulating layers IL2 and second sacrificial layers HL2. The second cell insulating layers IL2 are formed of or include the same material as the first cell insulating layers IL1. The second sacrificial layers HL2 are formed of or include the same material as the first sacrificial layers HL1. The uppermost second cell insulating layer IL2 is formed thicker than the other second cell insulating layers IL2 disposed therebelow.

Second channel holes CH2 are formed that penetrate the second mold structure MO2 and expose the first sacrificial patterns. The first sacrificial patterns are selectively removed through the second channel holes CH2. The selective removal of the first sacrificial patterns is performed using an etchant that contains hydrofluoric acid. Hereinafter, the first and second channel holes CH1 and CH2, which are connected to each other, are referred to as the channel hole CH.

Figure 11:
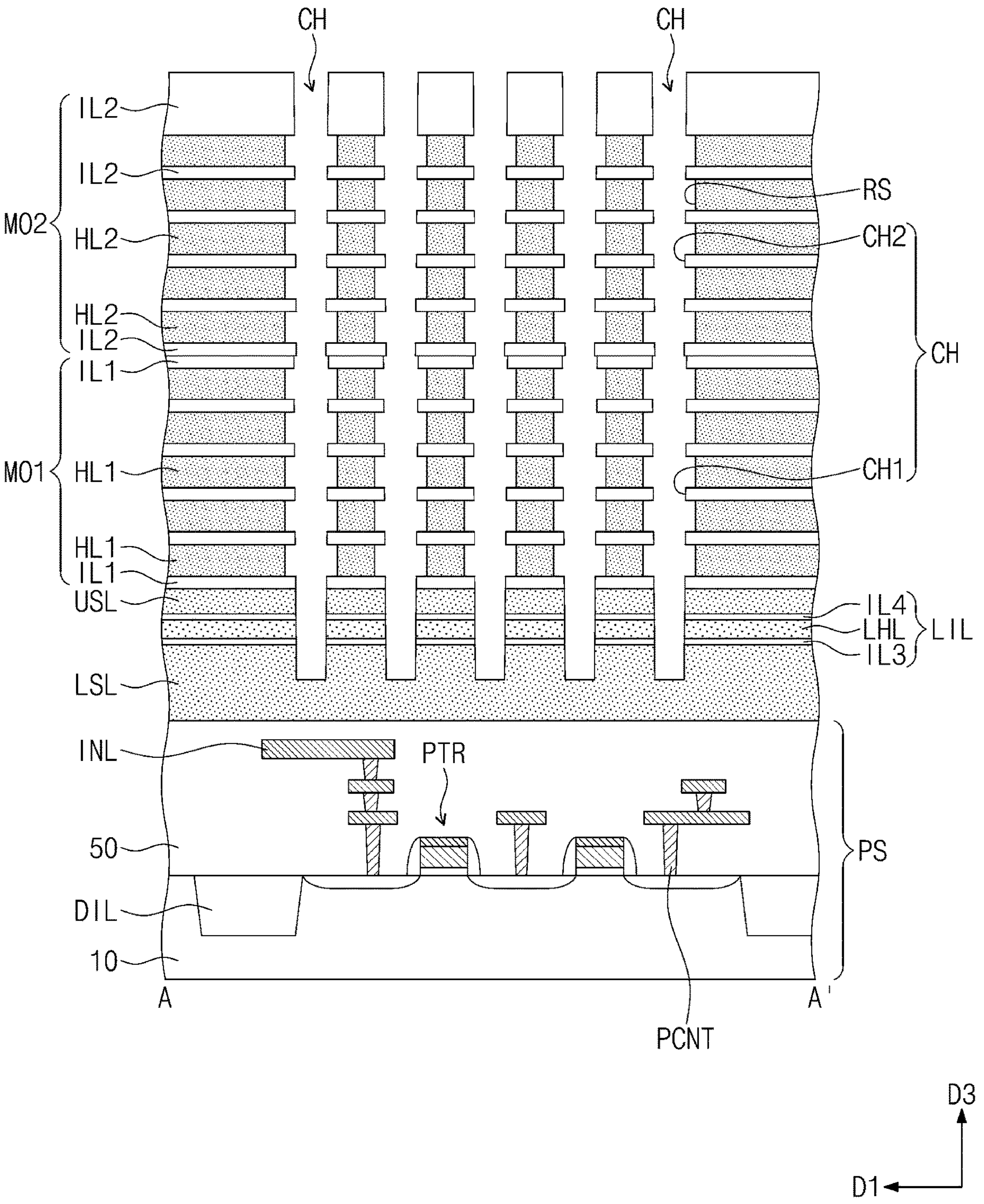

Referring to FIG. 11, in an embodiment, recess regions RS are formed by partially removing the first and second sacrificial layers HL1 and HL2 exposed by the channel holes CH, so that the electrodes are recessed from side surfaces of the cell insulating layers and the vertical channel pattern. The recess regions are defined by side surfaces of the cell insulating layers and the vertical channel pattern. During the formation of the recess regions RS, the first and second cell insulating layers IL1 and IL2 are not removed, and only portions of the first and second sacrificial layers HL1 and HL2 are selectively removed. In an embodiment, the formation of the recess regions RS is performed using an etchant that contains hydrofluoric acid.

Figure 12:
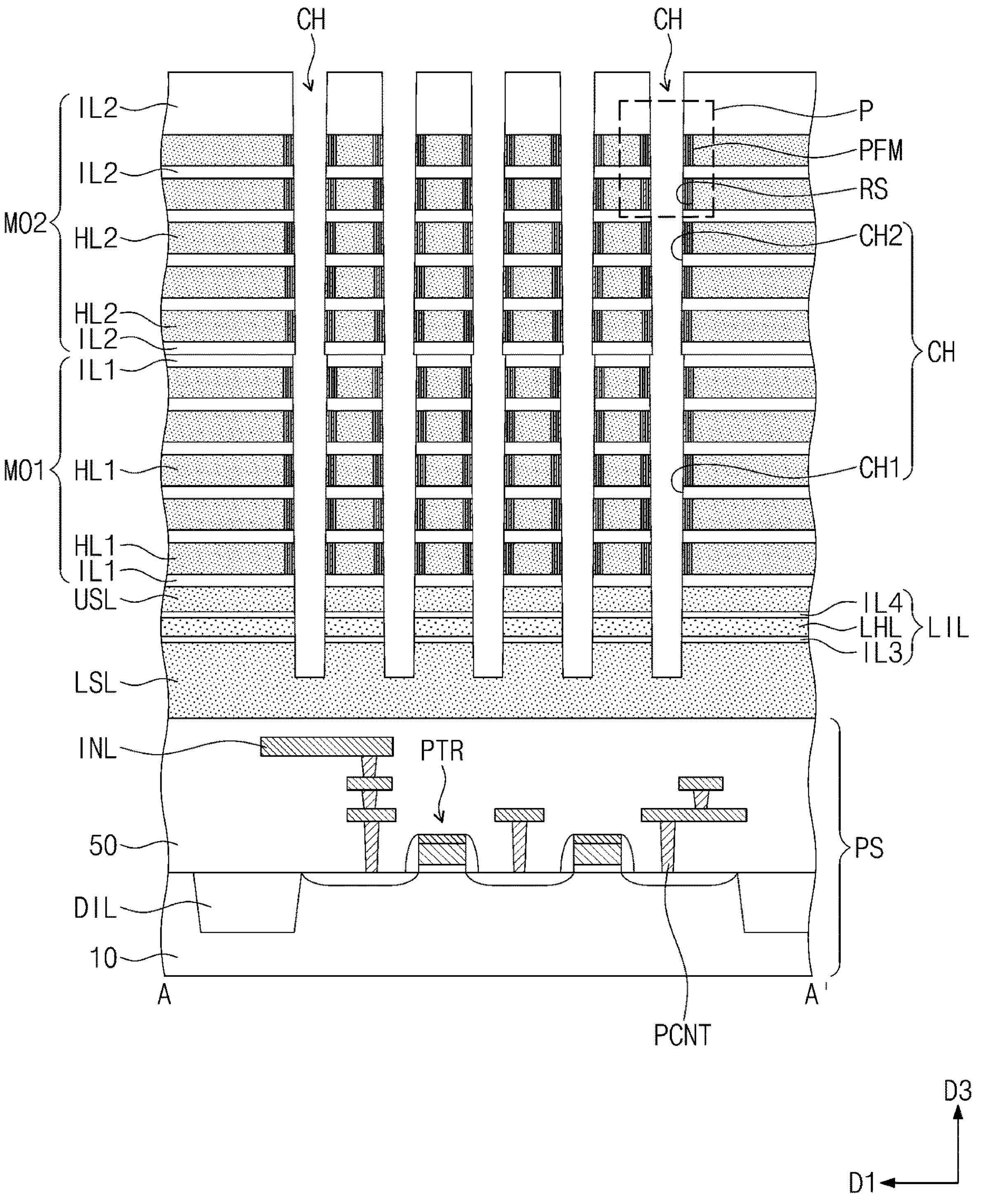
Figure 13:
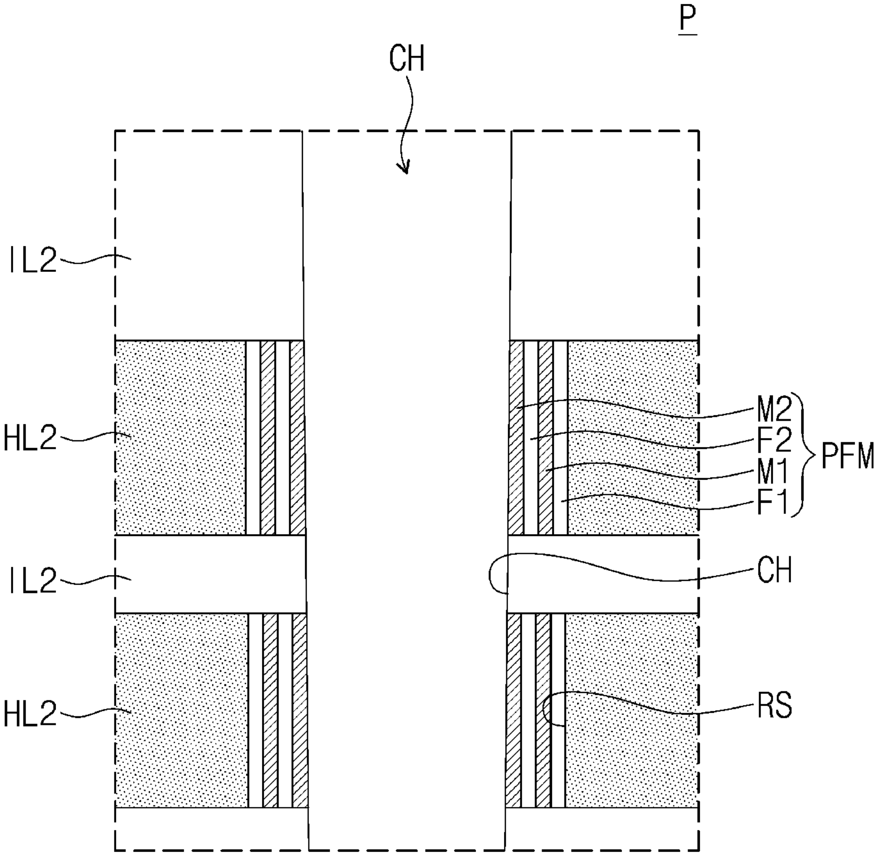
FIG. 13 is an enlarged sectional view of a portion 'P' of FIG. 12.

Referring to FIGS. 12 and 13, in an embodiment, the first ferroelectric pattern F1, the first conductive pattern M1, the second ferroelectric pattern F2, and the second conductive pattern M2 are sequentially formed in each of the recess regions RS. The first ferroelectric patterns F1 is formed by depositing a ferroelectric layer that extends into the channel holes CH and etching the ferroelectric layer. Similarly, each of the first conductive pattern M1, the second ferroelectric pattern F2, and the second conductive pattern M2 can be formed by depositing and etching a ferroelectric or conductive layer. As a result, preliminary data storage structures PFM that fill the recess regions RS are formed.

Figure 14:
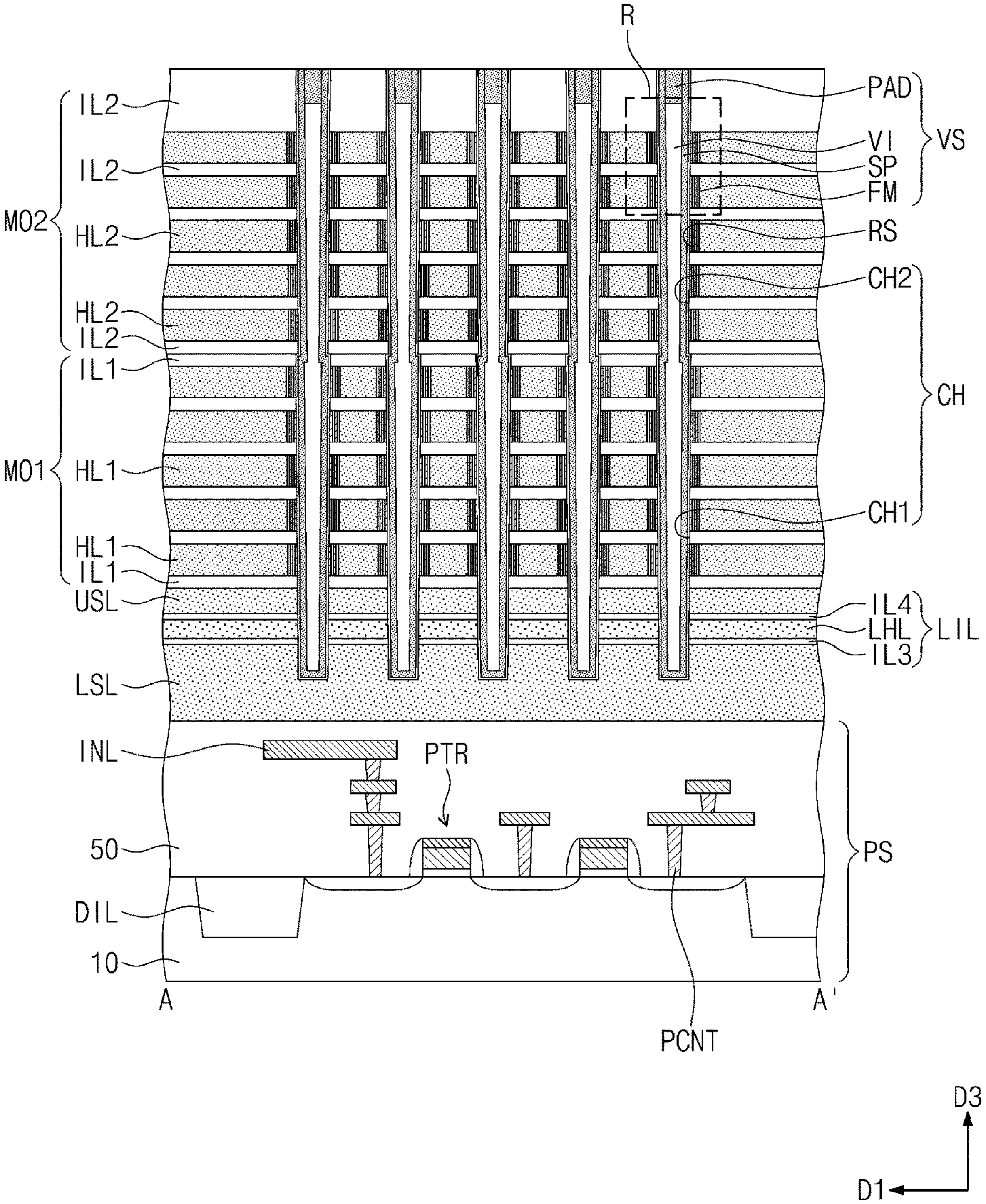
Figure 15:
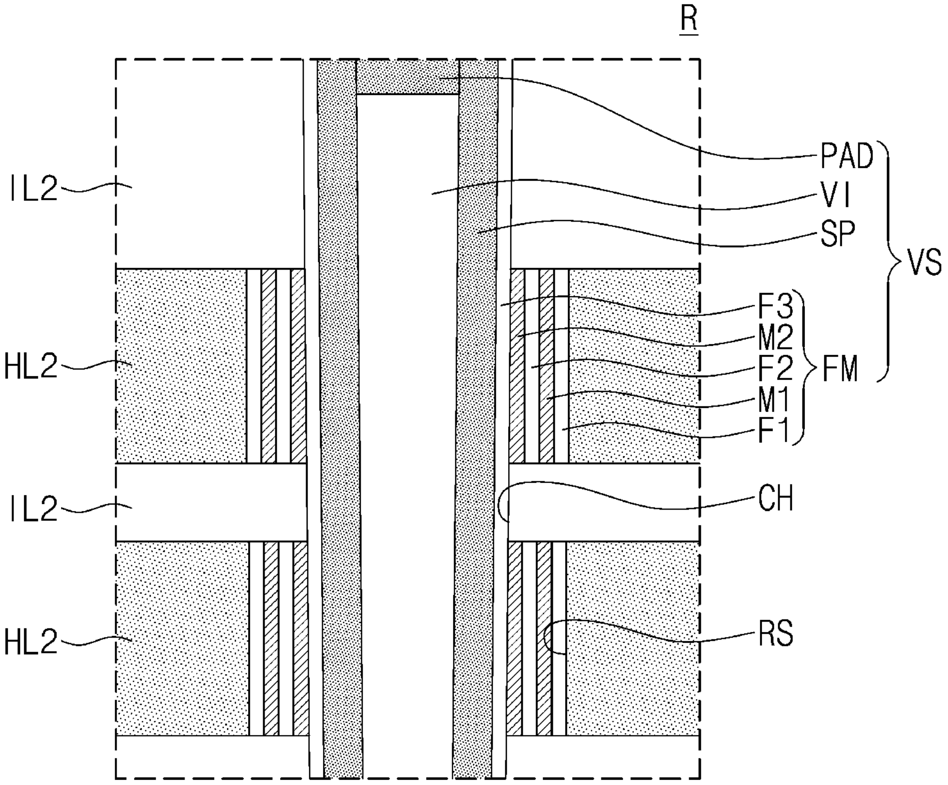
FIG. 15 is an enlarged sectional view of a portion 'R' of FIG. 14.

Referring to FIGS. 14 and 15, in an embodiment, the third ferroelectric pattern F3 is formed in the channel hole CH. The third ferroelectric pattern F3 extends along a side surface of the channel hole CH in the third direction D3 and is connected in common to the second conductive patterns M2. A lower portion of the third ferroelectric pattern F3 extends into the lower semiconductor layer LSL. As a result of the formation of the third ferroelectric pattern F3, the formation of the data storage structure FM is completed. Alternatively, in an embodiment of FIG. 9, the third ferroelectric patterns F3 is formed in the recess regions RS.

The vertical channel pattern SP and the gapfill insulating pattern VI are sequentially formed in the channel hole CH, and the conductive pad PAD is formed in the channel hole CH. As a result, the formation of the vertical structures VS is completed. The conductive pad PAD is formed of or includes at least one doped semiconductor material or conductive material. The formation of the vertical structures VS includes a planarization process, and as a result, a top surface of the uppermost second cell insulating layer IL2 is coplanar with a top surface of the conductive pad PAD.

Figure 16:
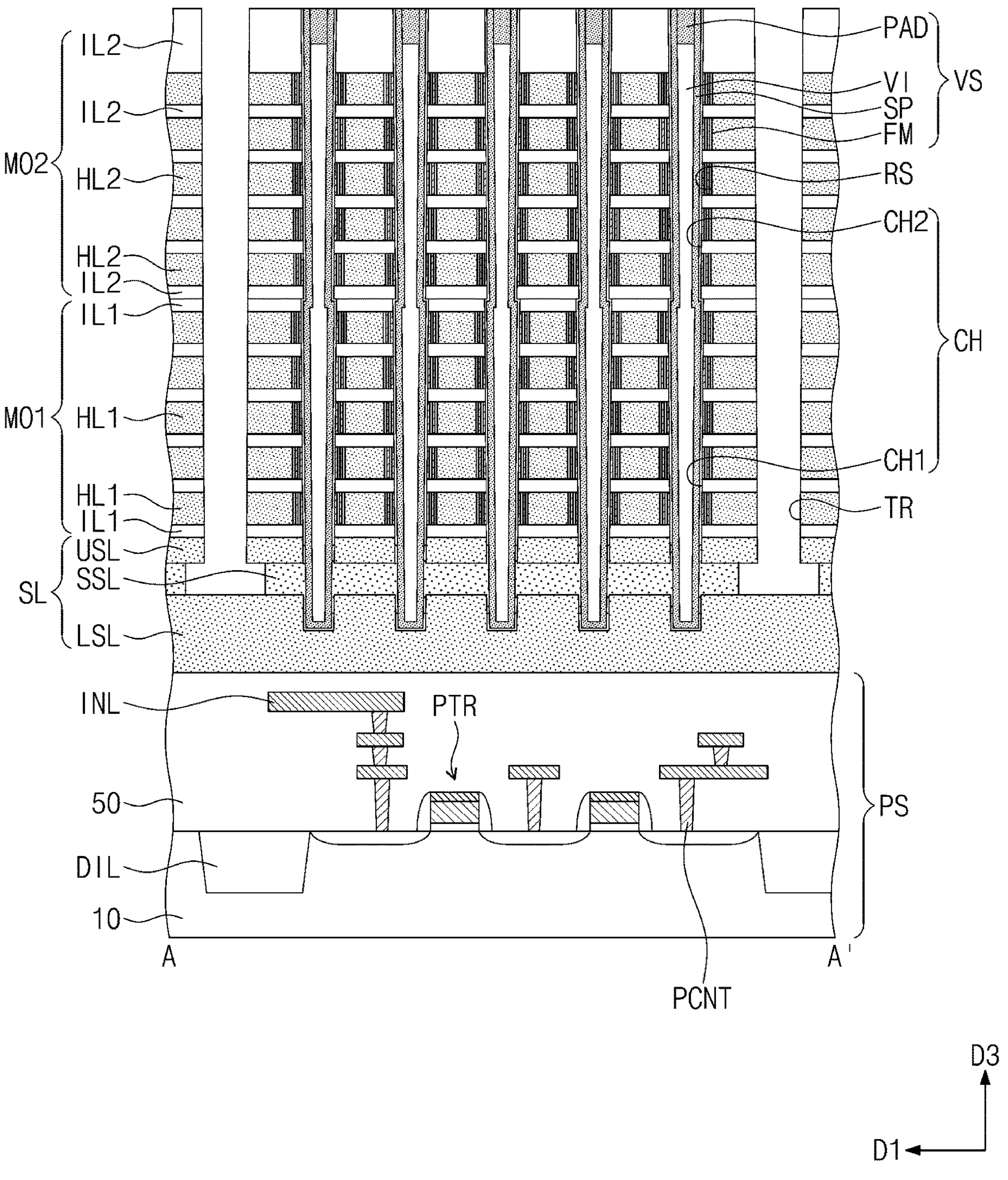

Referring to FIG. 16, in an embodiment, the trenches TR are formed that penetrate the second mold structure MO2 and the first mold structure MO1. The trenches TR extend in the second direction D2 and have a shape that corresponds to the separation structures SS described with reference to FIG. 5. Lower portions of the trenches TR expose the lower sacrificial layer LHL. The formation of the trenches TR includes an anisotropic etching process.

The lower sacrificial layer LHL exposed through the trenches TR is replaced with the source semiconductor layer SSL. For example, the lower sacrificial layer LHL is selectively removed through the trenches TR. As a result of the removal of the lower sacrificial layer LHL, a lower portion of the data storage structure FM is exposed. The exposed lower portion of the data storage structure FM is removed to form an undercut region. The undercut region exposes a lower portion of the vertical channel pattern SP. The lower and upper insulating layers IL3 and IL4 are also removed during the removal of the lower portion of the data storage structure FM. The source semiconductor layer SSL is formed in a space from which the insulating structure LIL was removed. The source semiconductor layer SSL is in contact with the vertical channel pattern SP.

Figure 17:
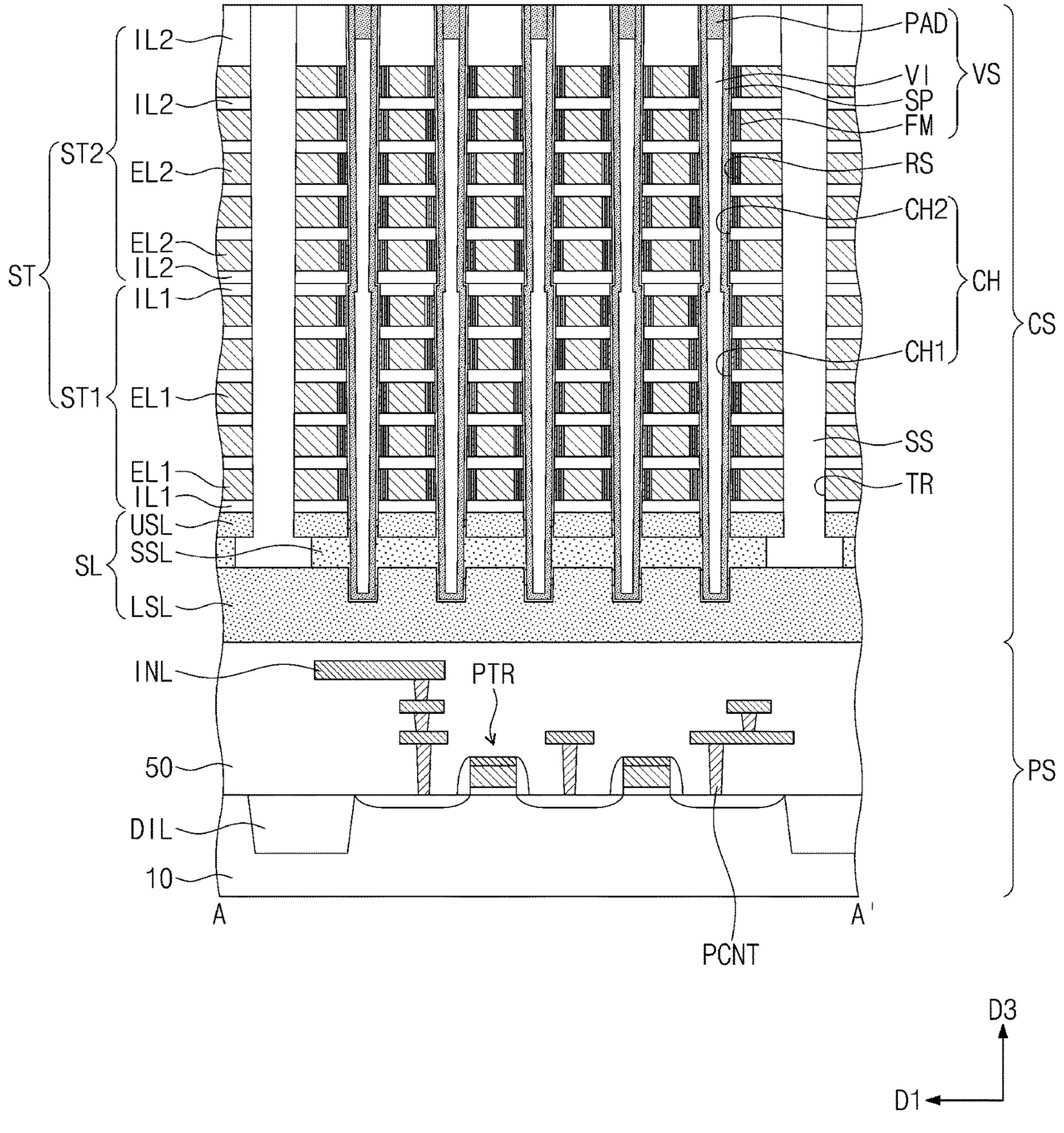

Referring to FIG. 17, in an embodiment, the gate stacks ST are formed by replacing the sacrificial layers HL1 and HL2 that are exposed by the trenches TR with the electrodes EL1 and EL2, respectively. For example, the sacrificial layers HL1 and HL2 are selectively removed. The electrodes EL1 and EL2 are respectively formed in spaces that are formed by removing the sacrificial layers HL1 and HL2. The separation structure SS are formed in the trench TR by filling the trench TR with an insulating material. The separation structure SS is formed of or includes silicon oxide.

Referring back to FIGS. 5 and 6, in an embodiment, the second interlayer insulating layer 161 is formed on the separation structure SS, and the first contact plugs CT1 are formed that penetrate the second interlayer insulating layer 161. The third interlayer insulating layer 162 is formed on the second interlayer insulating layer 161, and the second contact plugs CT2 are formed that penetrate the third interlayer insulating layer 162. The bit lines BL are formed on the third interlayer insulating layer 162. Interconnection layers are formed on the bit lines BL.

In an embodiment, the fabrication process includes at least one thermal treatment process. For example, a post-metallization annealing (PMA) process can be performed after the formation of the vertical structures VS and/or the interconnection layers. During the PMA process, an in-plane tensile stress is exerted on the first to third ferroelectric patterns F1, F2, and F3, which are in contact with the first and second conductive patterns M1 and M2 and the electrodes EL1 and EL2, and this increases a fraction of a portion that has an orthorhombic phase in the first to third ferroelectric patterns F1, F2, and F3. Thus, a ferroelectric property of the ferroelectric pattern is increased.

According to an embodiment of the inventive concept, owing to a structure of repeatedly-stacked ferroelectric and conductive patterns, a ratio of a portion that has an orthorhombic phase to the ferroelectric pattern is increased. Thus, a ferroelectric property of the ferroelectric pattern is increased. In addition, due to the structure of repeatedly-stacked ferroelectric and conductive patterns, an electric field can be concentrated on the ferroelectric pattern when a semiconductor memory device is operated, which lowers an operating voltage and reduces a strength of a depolarization field.

While embodiments of the inventive concept have been particularly shown and described, it will be understood by one of ordinary skill in the art that variations in form and detail may be made therein without departing from the spirit and scope of the attached claims.

What is claimed is:

1. A semiconductor memory device, comprising:

a stack disposed on a substrate, wherein the stack comprises electrodes and cell insulating layers that are alternately stacked on top of each other; and vertical structures that penetrate the stack, wherein each of the vertical structures comprises:

a vertical channel pattern that penetrates the stack; and a data storage structure disposed between the electrodes and the vertical channel pattern, wherein the data storage structure comprises first ferroelectric patterns that are respectively disposed on side surfaces of the electrodes, and first conductive patterns that are disposed between the first ferroelectric patterns and the vertical channel pattern, and the first ferroelectric patterns and the first conductive patterns are spaced apart from each other in a direction perpendicular to a top surface of the substrate with the cell insulating layers interposed therebetween.

2. The semiconductor memory device of claim 1, wherein the data storage structure comprises:

second ferroelectric patterns disposed between the first conductive patterns and the vertical channel pattern;

second conductive patterns disposed between the second ferroelectric patterns and the vertical channel pattern; and a third ferroelectric pattern disposed between the second conductive patterns and the vertical channel pattern.

3. The semiconductor memory device of claim 2, wherein the second ferroelectric patterns and the second conductive patterns are spaced apart from each other in a direction perpendicular to the top surface of the substrate with the cell insulating layers interposed therebetween.

4. The semiconductor memory device of claim 3, wherein the third ferroelectric pattern extends along a side surface of the vertical channel pattern and is connected in common to the second conductive patterns.

5. The semiconductor memory device of claim 3, wherein the third ferroelectric pattern comprises a plurality of third ferroelectric patterns that are spaced apart from each other in a direction perpendicular to the top surface of the substrate with the cell insulating layers interposed therebetween.

6. The semiconductor memory device of claim 2, wherein the third ferroelectric pattern is in contact with a side surface of the vertical channel pattern.

7. The semiconductor memory device of claim 1, wherein the first ferroelectric patterns are in contact with the side surfaces of the electrodes.

8. The semiconductor memory device of claim 1, wherein a thickness of each of the first ferroelectric patterns in a direction parallel to the top surface of the substrate is less than a thickness of the vertical channel pattern.

9. The semiconductor memory device of claim 1, wherein the electrodes are recessed from side surfaces of the cell insulating layers and the vertical channel pattern, and recess regions are defined by side surfaces of the cell insulating layers and the vertical channel pattern, wherein the first ferroelectric patterns and the first conductive patterns are disposed in the recess regions.

10. The semiconductor memory device of claim 1, wherein each of the first conductive patterns is in an electrically-floated state.

11. A semiconductor memory device, comprising:
a stack disposed on a substrate, wherein the stack comprises electrodes and cell insulating layers that are alternately stacked on top of each other; and
vertical structures that penetrate the stack,
wherein each of the vertical structures comprises:
a vertical channel pattern that penetrates the stack; and
a data storage structure disposed between the electrodes and the vertical channel pattern,
wherein the data storage structure comprises:
first ferroelectric patterns disposed on side surfaces of the electrodes;
first conductive patterns disposed between the first ferroelectric patterns and the vertical channel pattern;
second ferroelectric patterns disposed between the first conductive patterns and the vertical channel pattern;
second conductive patterns disposed between the second ferroelectric patterns and the vertical channel pattern; and
a third ferroelectric pattern disposed between the second conductive patterns and the vertical channel pattern, wherein the third ferroelectric pattern extends along a side surface of the vertical channel pattern and is connected in common to the second conductive patterns.

12. The semiconductor memory device of claim 11, wherein
the first ferroelectric patterns are spaced apart from each other in a direction perpendicular to a top surface of the substrate with the cell insulating layers interposed therebetween,
the first conductive patterns are spaced apart from each other in a direction perpendicular to the top surface of the substrate with the cell insulating layers interposed therebetween,
the second ferroelectric patterns are spaced apart from each other in a direction perpendicular to the top surface of the substrate with the cell insulating layers interposed therebetween, and
the second conductive patterns are spaced apart from each other in a direction perpendicular to the top surface of the substrate with the cell insulating layers interposed therebetween.

13. The semiconductor memory device of claim 11, wherein the third ferroelectric pattern is in contact with a side surface of the vertical channel pattern.

14. The semiconductor memory device of claim 11, wherein the first ferroelectric patterns are in contact with the side surfaces of the electrodes.

15. The semiconductor memory device of claim 11, wherein a thickness of each of the first ferroelectric patterns in a direction parallel to a top surface of the substrate is less than a thickness of the vertical channel pattern.

16. The semiconductor memory device of claim 11, wherein a thickness of each of the first conductive patterns in a direction parallel to a top surface of the substrate is less than a thickness of the vertical channel pattern.

17. The semiconductor memory device of claim 11, wherein the electrodes are recessed from side surfaces of the cell insulating layers and the vertical channel pattern, and recess regions are defined by side surfaces of the cell insulating layers and the vertical channel pattern,
wherein the first ferroelectric patterns, the first conductive patterns, the second ferroelectric patterns, and the second conductive patterns are disposed in the recess regions.

18. The semiconductor memory device of claim 11, wherein each of the first and second conductive patterns is in an electrically-floated state.

19. An electronic system, comprising:
a main substrate;
a semiconductor memory device disposed on the main substrate; and
a controller disposed on the main substrate and electrically connected to the semiconductor memory device,
wherein the semiconductor memory device comprises:
a stack that includes electrodes and cell insulating layers that are alternately stacked on top of each other; and
vertical structures that penetrate the stack,
wherein each of the vertical structures comprises:
a vertical channel pattern that penetrates the stack; and
a data storage structure disposed between the electrodes and the vertical channel pattern,
wherein the data storage structure comprises first ferroelectric patterns that are disposed on side surfaces of the electrodes, and first conductive patterns that are disposed between the first ferroelectric patterns and the vertical channel pattern, and
the first ferroelectric patterns and the first conductive patterns are spaced apart from each other in a direction perpendicular to a top surface of the substrate with the cell insulating layers interposed therebetween.

20. The electronic system of claim 19, wherein the data storage structure comprises:
second ferroelectric patterns disposed between the first conductive patterns and the vertical channel pattern;
second conductive patterns disposed between the second ferroelectric patterns and the vertical channel pattern; and
a third ferroelectric pattern disposed between the second conductive patterns and the vertical channel pattern,
wherein the third ferroelectric pattern extends along a side surface of the vertical channel pattern and is connected in common to the second conductive patterns.

* * * * *